United States Patent
De Milleri et al.

(10) Patent No.: US 11,863,933 B2
(45) Date of Patent: Jan. 2, 2024

(54) MEMS DEVICE

(71) Applicant: Infineon Technologies AG, Neubiberg (DE)

(72) Inventors: Niccoló De Milleri, Villach (AT); Christian Bretthauer, Munich (DE); Alessandro Caspani, Villach (AT); Alessandra Fusco, Munich (DE)

(73) Assignee: Infineon Technologies AG, Neubiberg (DE)

( * ) Notice: Subject to any disclaimer, the term of this patent is extended or adjusted under 35 U.S.C. 154(b) by 161 days.

(21) Appl. No.: 17/484,115

(22) Filed: Sep. 24, 2021

(65) Prior Publication Data

US 2022/0167095 A1 May 26, 2022

(30) Foreign Application Priority Data

Nov. 20, 2020 (EP) .................................... 20208986

(51) Int. Cl.
*H04R 19/00* (2006.01)
*B81B 7/00* (2006.01)

(52) U.S. Cl.
CPC ........... *H04R 19/005* (2013.01); *B81B 7/008* (2013.01); *B81B 2201/0257* (2013.01); *H04R 2201/003* (2013.01)

(58) Field of Classification Search
CPC .......... H04R 19/0005; H04R 2201/003; B81B 7/008; B81B 2201/02
See application file for complete search history.

(56) References Cited

U.S. PATENT DOCUMENTS

2016/0097855 A1* 4/2016 Qutub ................. H04R 29/004
367/99
2019/0208330 A1 7/2019 Bretthauer et al.

FOREIGN PATENT DOCUMENTS

WO 2016054370 A1 4/2016

OTHER PUBLICATIONS

Tang, Hao-Yen, "Interface Electronics for Ultrasonic Transducers", Berkley University, US, Technical Report No. UCB/EECS-2017-15, http://www2.eecs.berkeley.edu/Pubs/TechRpts/2017/EECS-2017-15.pdf, May 1, 2017, 72 pages, hereinafter "Hao". (Year: 2017).*

(Continued)

*Primary Examiner* — Sunita Joshi
(74) *Attorney, Agent, or Firm* — Slater Matsil, LLP

(57) ABSTRACT

A MEMS device includes a MEMS sound transducer, and control circuitry. The control circuitry includes a supply signal provider for providing a high-level supply signal and read-out circuitry for receiving an output signal from the MEMS sound transducer, and a switching arrangement for selectively connecting the MEMS sound transducer to the supply signal provider, and for selectively connecting the MEMS sound transducer to the read-out circuitry based on a control signal. The control circuitry provides the control signal having an ultrasonic actuation pattern to the switching arrangement during a first condition TX of the control signal, wherein the ultrasonic actuation pattern of the control signal triggers the switching arrangement for alternately coupling the high-level supply signal to the MEMS sound transducer.

19 Claims, 16 Drawing Sheets

(56) References Cited

OTHER PUBLICATIONS

Tang,Hao-Yen,"InterfaceElectronicsforUltrasonicTransducers", BerkleyUniversity,US,TechnicalReportNo. UCB/EECS-2017-15,http://Avww2.eecs.berkeley.edu/Pubs/TechRpts/2017/EECS-2017-15.pdf,May 1, 2017,72pages,hereinafter"Hao". (Year: 2017).*
Tang, Hao-Yen, "Interface Electronics for Ultrasonic Transducers", Berkley University, US, Technical Report No. UCB/EECS-2017-15, http://www2.eecs.berkeley.edu/Pubs/TechRpts/2017/EECS-2017-15.pdf, May 1, 2017, 72 pages.

* cited by examiner

MEMS DEVICE

This application claims the benefit of European Patent Application No. 20208986, filed on Nov. 20, 2020, which application is hereby incorporated herein by reference.

TECHNICAL FIELD

Embodiments of the present disclosure relate to a MEMS device, such as a MEMS microphone having an ultrasonic functionality. In particular, embodiments relate to a MEMS device in form a MEMS ultrasonic transceiver based on an analog microphone, such as a semiconductor (e.g., silicon) MEMS microphone.

BACKGROUND

The sensing of environmental parameters in the ambient atmosphere, such as noise, sound, temperature, etc., as well as the monitoring the direct environment of a mobile device for implementing, for example, a touchless gesture recognition, efficient proximity sensing, ambient temperature sensing, underwater communication, etc., gets more and more attention and importance in the implementation of appropriate sensors within mobile devices. In particular, on this field of sensors a low power consumption, portability and a small size has to be achieved for an implementation in portable and wearable applications for mobile devices.

Thus, in the field of sensors there is a constant need for sensor elements that detect their desired measurement variables, such as e.g., various ambient conditions of a mobile device, with a sufficiently high accuracy but with a low additional technical expenditure.

Such a need can be met by the subject matter of the present independent claims. Embodiments and further implementations of the present concept are defined in the dependent claims.

SUMMARY

In accordance with an exemplary embodiment, a MEMS device comprises a MEMS sound transducer, and a control circuitry. The control circuitry comprises a supply signal provider for providing a high-level supply signal, a read-out circuitry for receiving an output signal from the MEMS sound transducer, and a switching arrangement for selectively connecting the MEMS sound transducer to the supply signal provider, and for selectively connecting the MEMS sound transducer to the read-out circuitry based on a control signal, wherein the control circuitry is configured to provide the control signal having an ultrasonic actuation pattern to the switching arrangement during a first condition of the control signal, wherein the ultrasonic actuation pattern of the control signal triggers the switching arrangement for alternately coupling the high-level supply signal to the MEMS sound transducer.

According to an embodiment, the first portion of the control signal enables a transmission mode of the MEMS sound transducer, and wherein a second condition of the control signal enables a sense mode of the MEMS sound transducer.

BRIEF DESCRIPTION OF THE DRAWINGS

In the following, embodiments of the present disclosure are described in detail with respect to the figures, in which.

In the following description, embodiments are discussed in further detail using the figures, wherein in the figures and the specification identical elements and elements having the same functionality and/or the same technical or physical effect are provided with the same reference numbers or are identified with the same name. Thus, the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

Figure 1:
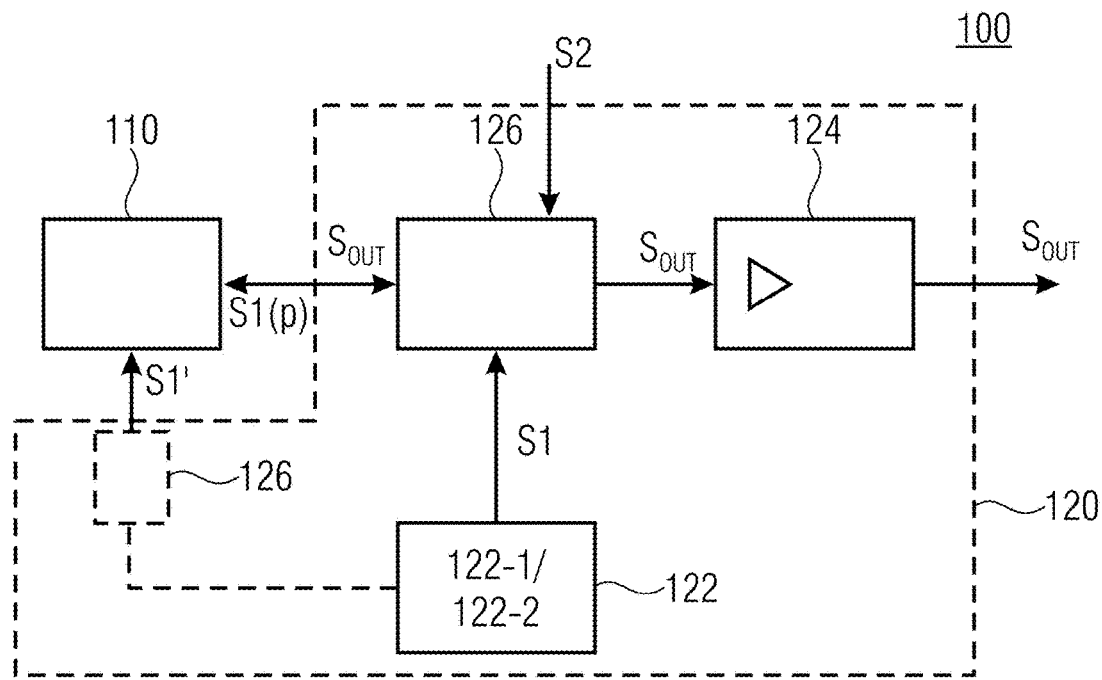
FIG. 1 shows a schematic block diagram of a MEMS device comprising a MEMS sound transducer and a control circuitry according to an embodiment.

FIG. 1 shows a schematic block diagram of a MEMS device 100 with the different functional blocks according to an embodiment.

According to an embodiment, the MEMS device 100 comprises a MEMS sound transducer 110 and a control circuitry 120. The control circuitry 120 comprises a supply signal provider 122 for providing a high-level supply signal S1, a read-out circuitry 124 for receiving an output signal $S_{OUT}$ from the MEMS sound transducer 110, and a switching arrangement 126 for selectively connecting the MEMS sound transducer 110 to the supply signal provider 122, and for selectively connecting the MEMS sound transducer 110 to the read-out circuitry 124 based on a control signal S2. The control circuitry 120 is configured to provide the control signal S2 having an ultrasonic actuation pattern P to the switching arrangement 126 during a first condition TX of the control signal S2, wherein the ultrasonic actuation pattern P of the control signal S2 triggers the switching arrangement 126 for alternately coupling the high-level supply signal S1 to the MEMS sound transducer 110.

According to an embodiment, the first condition TX of the control signal S2 enables a transmission mode of the MEMS sound transducer 110, and wherein a second condition RX of the control signal S2 enables a sense mode of the MEMS sound transducer 110.

Thus, the control signal S2 has the first condition or first signal portion TX defining an ultrasonic transmission mode of the MEMS device 100, and the second condition or second signal portion RX defining an acoustic reception mode RX of the MEMS device 100, wherein the control signal S2 has only in the first condition TX the ultrasonic actuation pattern P.

The first condition TX of the control signal S2 enables the transmission mode of the MEMS sound transducer 110, wherein the ultrasonic actuation pattern P of the control signal S2 triggers the switching arrangement 126 for alternately coupling the high-level supply signal S1 to the MEMS sound transducer 110, and wherein the switching arrangement 126 electrically disconnects the MEMS sound transducer 110 from the read-out circuitry 124.

The second condition RX of the control signal S2 enables a sense mode (=reception mode) RX of the MEMS sound transducer 110, wherein in the sense mode the switching arrangement 122 electrically disconnects the MEMS sound transducer 110 from the supply signal provider 122 and electrically connects the acoustic output signal $S_{OUT}$ of the MEMS sound transducer 110 to the read-out circuitry 124.

According to an embodiment, the supply signal provider 122 may optionally comprise a hold capacitor for storing the high-level supply signal S1 and for providing the high-level supply signal S1 during the transmission mode TX to the MEMS sound transducer 110.

According to an embodiment, the supply signal provider 122 may be configured to charge the hold capacitor during the sense mode RX with the high-level supply signal S1.

According to an embodiment, the switching arrangement 126 is configured to decouple the supply signal provider 122 and the (optional) hold capacitor during the sense mode from the MEMS sound transducer 110 and the read-out circuitry 124.

According to an embodiment, the supply signal provider 122 may be configured to provide the high-level supply signal S1 in a low-ohmic configuration, wherein the signal (voltage) level V1 of the high-level supply signal S1 is higher than a common supply signal $V_{DD}$ of the MEMS device 100.

According to an embodiment, the supply signal provider 122 may comprise a charge pump arrangement 122-1 for providing the high-level supply signal S1 to the MEMS sound transducer 110, wherein the voltage level V1 of the high-level supply signal S1 is higher than a common supply signal $V_{DD}$ of the MEMS device 100.

According to an embodiment, the supply signal provider 122 may comprise a further charge pump arrangement 122-2 wherein the further charge pump arrangement 122-2 is configured to provide a further high-level supply signal S1' during the sense mode or the transmission mode to the MEMS sound transducer 110. The supply signal provider 122 is further configured to provide the high-level supply signal S1 during the transmission mode to the MEMS sound transducer 110.

According to a further embodiment, the supply signal provider 122 may generally comprise any circuit block 122-1, 112-2 that is able to generate the low-ohmic high-level voltages V1, V1' (e.g., >10V).

According to an embodiment, the MEMS sound transducer 110 may comprises a membrane structure and a counter electrode structure, wherein the membrane structure and the counter electrode structure are arranged to provide a differential excitation and differential read-out configuration of the MEMS sound transducer 110 or to provide a single-ended (=common mode) excitation and single-ended read-out configuration of the MEMS sound transducer 110.

According to an embodiment, the switching arrangement 126 may comprises (at least) four switches for the differential excitation and differential read-out configuration of the MEMS sound transducer 110 for alternately coupling the high-level supply signal S1 of the supply signal provider 122 to the MEMS sound transducer 110 during the ultrasonic transmission mode TX.

According to an embodiment, wherein the switching arrangement 126 may comprises (at least) two switches for the single-ended excitation and single-ended read-out configuration of the MEMS sound transducer 110 for alternately coupling the high-level supply signal S1 of the supply signal provider 122 to the MEMS sound transducer 110 during the ultrasonic transmission mode TX.

According to an embodiment, the switching arrangement 126 is connected between the MEMS sound transducer 110, the supply signal provider 122 and the read-out circuitry 124 for selectively connecting the MEMS sound transducer 110 to the supply signal provider 122 during the ultrasonic transmission mode TX, and for selectively connecting the acoustic output signal $S_{OUT}$ of the MEMS sound transducer 110 to the read-out circuitry 124 during the sense mode RX. The switching arrangement may comprise PMOS switches between the supply signal provider 122 and the MEMS sound transducer 110, and NMOS switches between the MEMS sound transducer 110 and the read-out circuitry 124.

According to an embodiment, the read-out circuitry 124 may comprise an operational amplifier for receiving and amplifying the acoustic (=audio and/or ultrasonic range) output signal $S_{OUT}$ from the MEMS sound transducer 110, e.g. in a high-impedance read-out configuration.

The audio frequency range may be between approximately 10 Hz and 20 kHz or between 20 Hz and 15 kHz, wherein the ultrasonic frequency range between 20 kHz and 300 kHz, between 20 and 150 kHz, between 20 and 120 kHz or between 50 and 150 kHz.

According to an embodiment, a first portion (low sens) RX1 of the sense mode RX following the transmission mode TX forms a recovery period of the MEMS sound transducer 110, wherein the control circuitry 120 may provide a low-ohmic interface during the recovery period. The low-ohmic recovery mode enables a bypass switch across the high-ohmic blocks at the ASIC 120 input.

According to an embodiment, the control signal S2 may be based on a combination of a first control signal component S2-1 and a second control signal component S2-2, and wherein the control circuitry 120 is configured to provide the second control signal component S2-2 having the ultrasonic actuation pattern P to the switching arrangement 126 only during a first condition (=first logic value) of the first control signal component S2-1, wherein the second control signal component S2-2 triggers the switching arrangement 126 for alternately coupling the high-level supply signal S1 to the MEMS sound transducer 110 based on the ultrasonic actuation pattern P.

According to an embodiment, the first control signal component S2-1 and the second control signal component S2-2 may be standard digital signals, wherein the control circuitry 120 may configured to gate, e.g. with a logical AND conjunction, the second control signal component S2-2 having the ultrasonic actuation pattern P to the switching arrangement 126 for triggering the switching operation only during the presence of the predefined first logic level of the first control signal component S2-1, wherein the actuation pattern P provides and defines the ultrasonic excitation frequency of the MEMS sound transducer 110.

According to an embodiment, the control circuitry 120 may be part of an ASIC for providing an integrated on-chip implementation of the signal generation for controlling the operations modes of the MEMS sound transducer 110 of the MEMS device 100.

According to the present embodiments, the present concept for a MEMS device 110 allows to add an ultrasound transducer feature to a (standard) MEMS microphone functionality with no size increase needed and without adding system complexity or assembly/package/system modifications.

Thus, the implementation of the MEMS device 100 according to the above embodiments is an inexpensive but effective way of implementing the MEMS device 100 having a fully integrated ultra-sound transceiver (differential or single-ended) without losing the standard microphone functionality, all-in-one. The control signal S2, e.g. two added control signal components S2-1, S2-2 (standard digital), allow to switch from microphone RX to ultrasound transmission TX and to adjust the excitation ultrasonic frequency, e.g. eventually tuning it to the system resonances.

Embodiments of the MEMS device 110 achieve an implementation of a fully integrated ultrasonic transducer with differential/single-ended excitation method or configuration, controllable with two standard digital input signals (signal components) S2-1, S2-2. Such a solution offers the standard audio performance of MEMS microphones combined with the ultrasonic transducer capabilities all-in-one. This specific solution ensures the maximum ultrasonic power transmitted by the specific MEMS used, in addition to an effective and inexpensive integration due to the simplicity of the standard digital control signals.

The MMES device 110 has two main operation modes and only needs an additional control signal (or two additional control signal components) with respect to a standard MEMS microphone that allow to switch from standard audio (receive—RX) mode to ultrasonic signal transmission mode (send—TX) with a tuneable frequency (=tuneable ultrasonic actuation frequency) of the actuation pattern P.

During audio mode (RX) the audio performance of the MEMS sound transducer 110 (MEMS microphone) is unchanged. During transmission (TX), the MEMS sound transducer 110 is excited with the ultrasonic actuation pattern P at the (tuned) ultrasound frequency with an internal voltage generator (=the supply signal provider 122) that brings the membrane of the MEMS sound transducer 110 to its maximum displacement on both gaps alternatively, based on the ultrasound signal pattern P and generating the ultrasound transmission signal pattern. At the end of the excitation the MEMS device 100 switches back to receive mode RX and starts sensing the returning ultrasound waves (in addition to the standard audio signals) during RX2 after a short recovery time RX1 (low sens. period).

Figure 2:
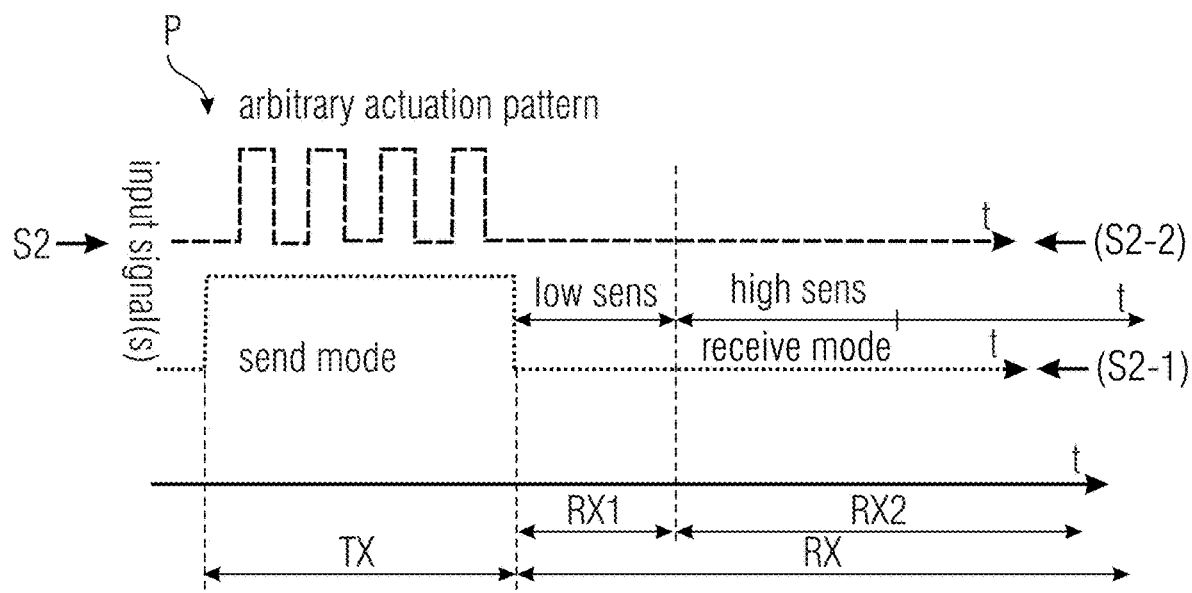
FIG. 2 shows an exemplary illustration of the temporal course of the control signal for the MEMS device having the ultrasonic actuation pattern (e.g., only) during the ultrasonic transmission mode of the MEMS device according to an embodiment.

FIG. 2 shows an exemplary illustration of the temporal course of the control signal S2 for the MEMS device 110 as provided by the control circuitry 120 to the switching arrangement 126 according to an embodiment. The control signal S2 has the ultrasonic actuation pattern P (e.g., only) during the ultrasonic transmission mode TX (send mode) of the MEMS sound transducer 110 of the MEMS device 100.

According to an embodiment, the control signal S2 may be based on a logical combination of a first control signal component S2-1 and a second signal component S2-2. The control circuitry 120 may be configured to provide the second control signal component S2-2 having the ultrasonic actuation pattern P to the switching arrangement 126 only during a first condition TX (=first logic value) of the first control signal component S2-1, wherein the second control signal component S2-2 triggers the switching arrangement for alternately coupling the high-level supply signal S1 to the MEMS sound transducer 110 based on the ultrasonic actuation pattern P. Thus, the ultrasonic actuation pattern P of the second control signal component S2-2 triggers the switching arrangement for alternately coupling the high-level supply signal S1 to the MEMS sound transducer 110.

According to an embodiment, the first control signal component S2-1 and the second control signal component S2-2 may be standard digital signals (having two logic levels), wherein the control circuitry 120 is configured to gate, e.g. in form of a logical AND conjunction, the second control signal component S2-2 having the ultrasonic actuation pattern P to the switching arrangement 126 for triggering the switching operation only during the presence of the predefined first logic level of the first control signal component S2-1, wherein the actuation pattern P defines the ultrasonic excitation frequency of the MEMS sound transducer 110.

According to an embodiment, the second control signal component 2-2 may comprise the ultrasonic actuation pattern P as a continuous pattern, for example. The set or adjusted frequency of the actuation pattern P corresponds to the transmitted ultrasonic signal of the MEMS sound transducer 110. Thus, an arbitrary actuation pattern in frequency may be provided to the switching arrangement 126.

Therefore, the provided control signal S2 defines the operation of the MEMS sound transducer 110 with respect to a send mode (transmission mode=the first portion TX of the control signal S2) and a receive mode (=the second portion RX of the control signal S2). As further shown in FIG. 2, the receive mode RX comprises a region RX1 with a low reception sensitivity (immediately subsequent to the send mode) and a region RX2 with a high reception sensitivity timely subsequent to the low sensitivity region T2-1. The periods RX1 and RX2 having different reception sensitivities for an ultrasonic echo signal result from the structure of the MEMS sound transducer 110 and will be described in more detail below with respect to FIGS. 3 to 5.

According to an embodiment, the control signal S2 may be provided from an external circuit element and/or processing device to the control circuitry 120 or may be generated by the control circuitry 120. Further, the first control signal component S2-1 and a second signal component S2-2 may be provided from an external circuit element and/or processing device to the control circuitry 120, wherein the control circuitry 120 generates the control signal S2 and provides the control signal S2 to the switching arrangement 126.

According to the above evaluations, the control signal S2 is the trigger signal for the switches of the switching arrangement 126 to switch the supply signal provider 122 (e.g., the charge pumps or other high-voltage elements) on and off at the excitation frequency of the MEMS sound transducer 110, wherein the frequency of the actuation pattern P of the control signal S2 may be set or tuned to the resonance frequency or one of the resonance frequencies of the MEMS sound transducer 110 (MEMS microphone).

According to an embodiment, the actuation pattern P can be a continuous pattern of the second control signal component S2-2, wherein the resulting control signal S2 is enabled (gated) by the digital (1-0) switch-on signal (=the first control signal component S2-1), the switch-on signal S2-1 toggling (switching) "globally" between the send mode TX and receive mode RX. In the "low sens" (low sensitivity) range RX1, the MEMS interface (=MEMS sound transducer 110 interface=the terminals of the MEMS sound transducer 110) is in a low-ohmic state in order to make the recovery period as short as possible, since the following applies: the shorter the recovery period, the shorter distances can be detected in the ultrasonic mode. The low-ohmic recovery mode enables a bypass switch across the high-ohmic blocks at the ASIC 120 input, for example.

Figure 7A:
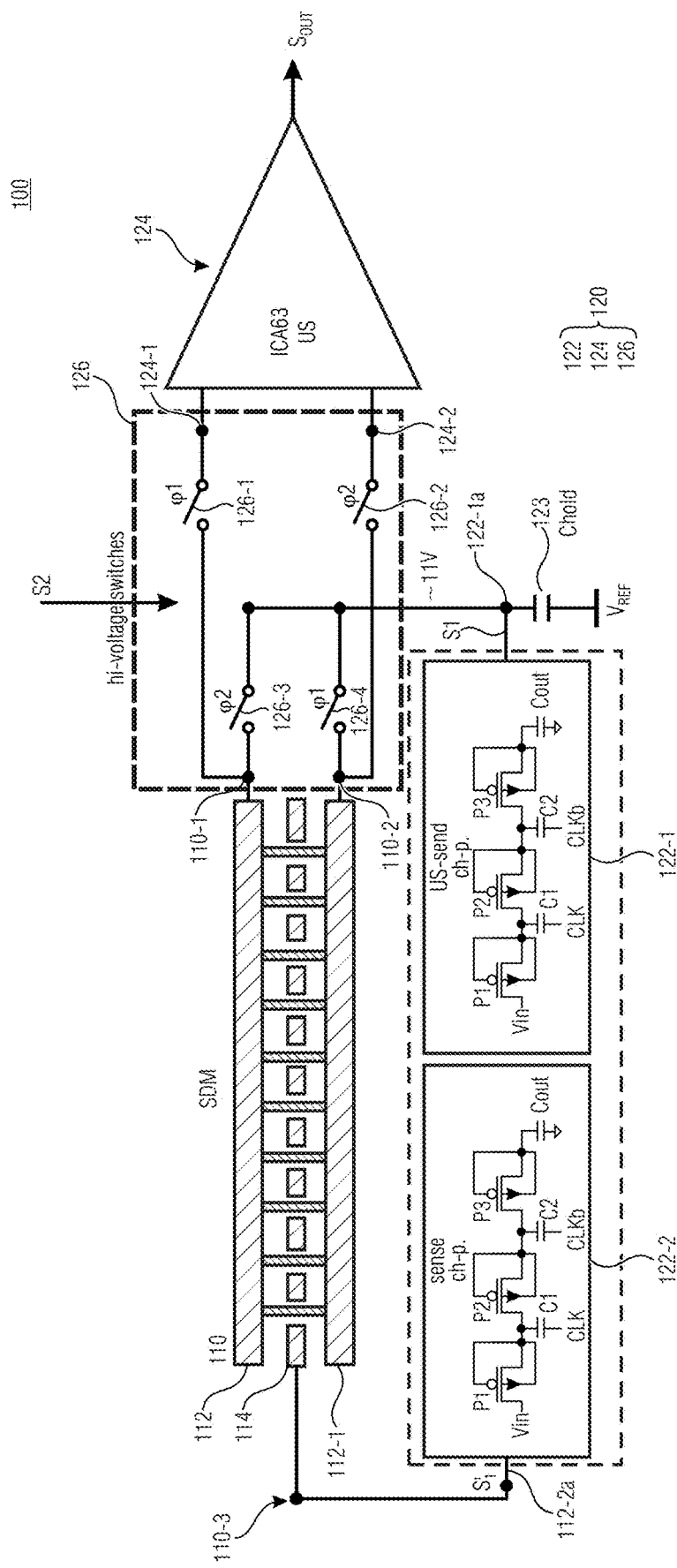
FIG. 7a shows a schematic cross-sectional view of the MEMS sound transducer together with a schematic block diagram of the control circuitry of the MEMS device in a differential excitation and read-out configuration of the MEMS sound transducer according to an embodiment.
Figure 7B:
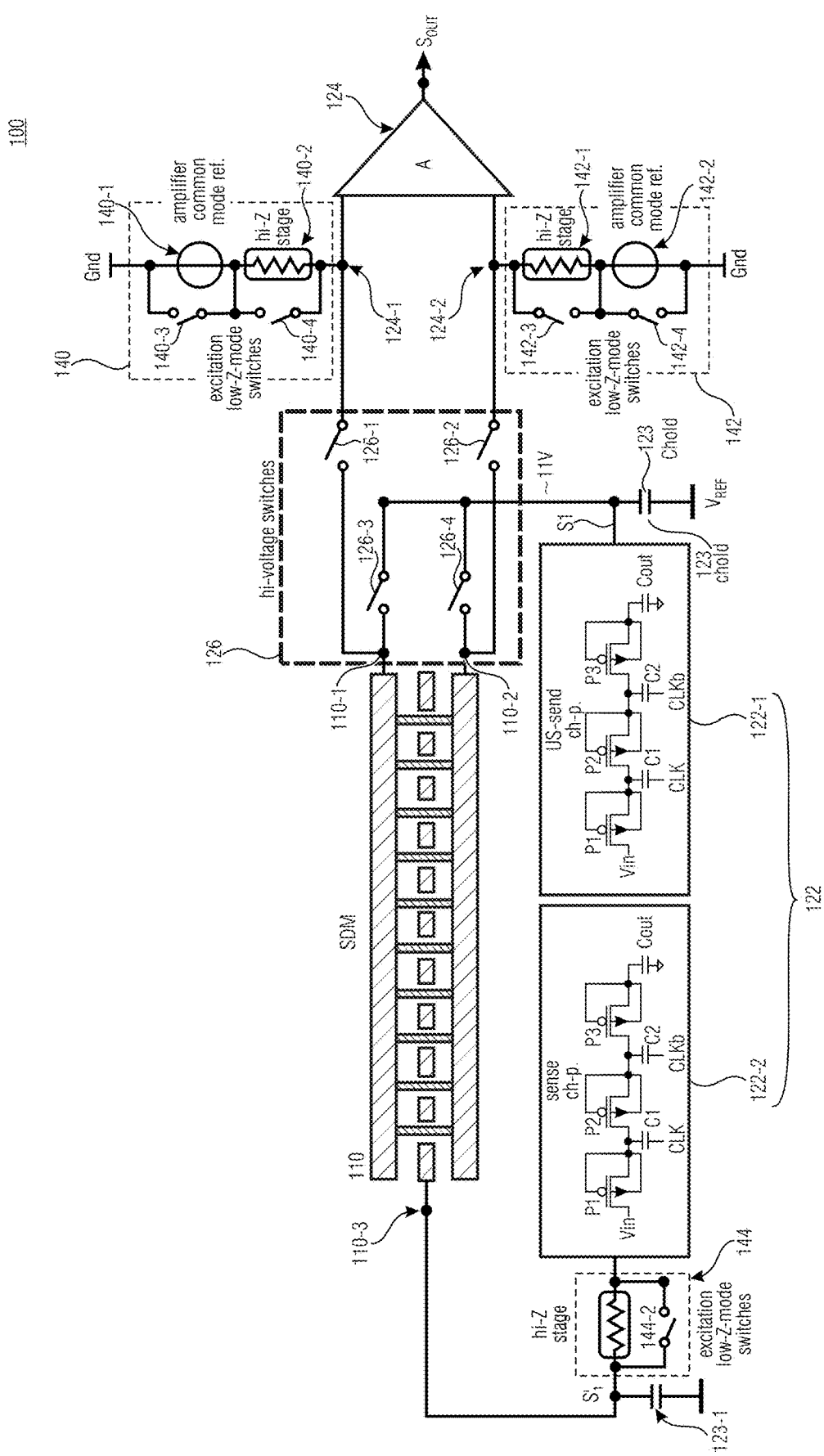
FIG. 7b shows the schematic cross-sectional view of the MEMS sound transducer of FIG. 7a together with schematic implementation of exemplary bypass switches according to an embodiment.

With respect to an exemplary implementation of the bypass switch(es) according to an embodiment, it is referred to FIG. 7b and the associated specification, for example.

During the recovery period RX1, the oscillation of the MEMS microphone 110 will abate or fade away (=ringing), with the MEMS microphone 110 returning to normal sound reception mode. Due to the low-resistance or low-resistance state of the MEMS interface, short time constants can be achieved in order to be able to achieve the receive mode RX as quickly as possible.

In the present concept, the entire signal generation may be carried out in the ASIC, which enables complete integration of the control electronics or the entire system. In addition, both modes of operation (single-ended mode—differential mode) are improved, whereby the integration of the MEMS system 100 can also be simplified.

Figure 3A:
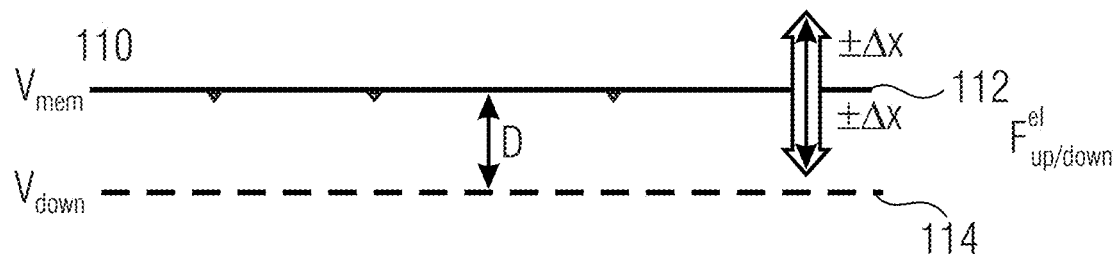
FIGS. 3a-3c show a schematic cross-sectional views of the MEMS sound transducer in different configurations (—in a single membrane and backplate configuration, —in a (sealed) dual membrane configuration and—in a dual-backplate configuration) according to an embodiment.
Figure 3B:
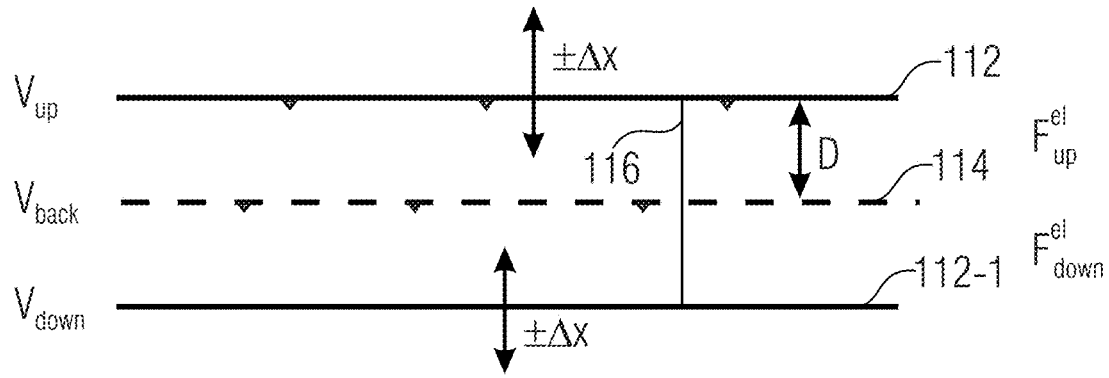
Figure 3C:
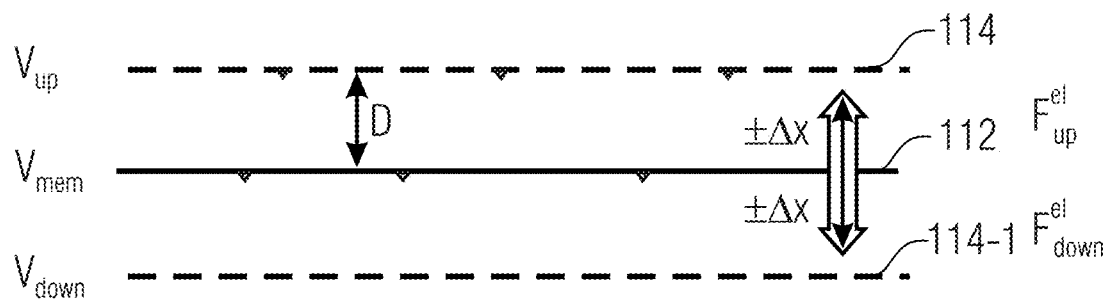

FIGS. 3a-3c show a schematic cross-sectional views of the MEMS sound transducer 110 in different configurations, such as in a single membrane and single backplate (=counter-electrode) configuration, in a (e.g., sealed) dual membrane configuration and in a dual-backplate configuration.

FIG. 3a shows a schematic cross-sectional view of the MEMS sound transducer 110 in single membrane and single backplate configuration. As shown in FIG. 3a, the MEMS sound transducer 110 has the membrane structure 112 and the counter electrode structure 114. The term "structure" is intended to illustrate that the membrane and the counter-electrode, respectively, can comprise a semi-conductive layer or, also, a layer sequence or layer stack having a plurality of different layers, wherein at least one of the layers is electrically conductive.

The layer arrangement may be positioned on a carrier substrate 131 (see FIG. 4), wherein the membrane structure 112 and the counter electrode structure 114 are separated and spaced apart from one another. The counter electrode structure 114, which is generally configured to be more rigid than the deflectable membrane structure 112, is spaced apart at a distance D from the membrane structure, with the result that a capacitance $C_o$ (=MEMS capacitance=capacitance of the MEMS sound transducer 110) can form between the counter electrode structure 114 and the membrane structure 112 and can be sensed by the readout circuitry 124 of the control circuitry 112. The non-clamped region of the membrane structure 112 (with respect to the counter electrode structure 114) is referred to as the deflectable (=displaceable) or movable region (=active region) of the membrane structure 112. A deflection $\Delta x$ of the membrane structure 112 relative to the counter electrode structure 114 can then be detected and read out as a capacitance change $\Delta C$ by means of the readout circuitry 124 in order to provide a corresponding (analog or AD-converted digital) output signal $S_{out}$ of the MEMS sound transducer 110. The deflection of the membrane structure 114 is (generally) caused by an acoustic sound pressure change in the environment.

As shown in FIG. 3*b*, the MEMS sound transducer 110 having a dual membrane MEMS configuration (or sealed dual membrane configuration) comprises the first membrane structure 112 and a further (second) membrane structure 112-1 spaced apart therefrom with the counter electrode structure 114 arranged there between, wherein the counter electrode structure 114 is spaced apart each from the first and second membrane structures 112, 112-1. Furthermore, at least one or a plurality mechanical connection elements 116 can be provided between the first and second membrane structures 112, 112-1, wherein the mechanical connection element(s) is mechanically coupled between the first and second membrane structures 112, 112-1 and is mechanically decoupled from the counter electrode structure 114.

In a sealed dual membrane configuration, the first and second membrane structures 112, 112-1 are arranged in a hermetically sealed configuration, and a cavity 116 may be formed between the first and the second membrane structure 112, 112-1, wherein the counter electrode structure 114 is arranged in the cavity 116, e.g. when compared to the environmental atmosphere. The cavity 116 may comprise a reduced atmospheric pressure, e.g., a "vacuum" with an atmospheric pressure of about or below 100 Torr, 50 Torr, 5 Torr or 1 Torr.

Upon a deflection of the first and second (mechanically coupled) membrane structures 112, 112-1 relative to the counter electrode structure 114, that deflection or displacement can in turn be read out capacitively, for example, by the readout circuitry 124 in order to provide the output signal $S_{OUT}$ dependent on the deflection (gap change) with respect to the counter electrode structure 112. The deflection of the membrane structure 114 is caused by an acoustic sound pressure change in the environment. In case of the dual-membrane arrangement as shown in FIG. 3*b*, the read-out circuitry 124 can be configured to read out the MEMS sound transducer 110 in a "single-ended" (common-mode) or differential configuration.

According to a further configuration of the MEMS sound transducer 110 as a MEMS microphone as shown in FIG. 3*c*, the MEMS sound transducer 110 may comprise a dual-counter electrode configuration (dual backplate configuration), wherein the MEMS sound transducer 110 may comprise a first counter-electrode structure 114 and a further (second) counter-electrode structure 114-1, such that the membrane structure 112 is arranged between the first and second counter electrode structures 114, 114-1. In case of the dual-counter electrode arrangement as shown in FIG. 3*c*, the read-out circuitry 124 can be configured to read out the MEMS sound transducer 110 in a "single-ended" (common-mode) or differential configuration.

In case of the dual-backplate configuration, the read-out circuitry 124 may be configured to detect the deflection or displacement Δx of the membrane structure 112 relative to the counter electrode structure 114 and/or relative to the further (second) counter electrode structure 114-1, depending on the single-ended (common mode) or differential readout configuration. The deflection of the membrane structure 114 is again caused by an acoustic sound pressure change in the environment.

In the following, the electrostatic actuation principle is discussed. The electrostatic forces in a differential MEMS sound transducer, e.g. a dual backplate (DBP) device, can be described as follows:

Electrostatic forces:

$$F_{up}^{el} \sim (\Delta V_{up} / \text{gap}_{up})^2$$

$$F_{down}^{el} \sim (\Delta V_{down} / \text{gap}_{down})^2$$

Restoring mechanical spring force:

$$F^{mech} = k(\text{gap}_{up} - \text{gap}_{down})$$

wherein the signal $V_{up}$ is the voltage at the first counter electrode structure 114, the signal $V_{down}$ is the voltage at the second counter electrode structure 114-1, and the signal $V_{MEM}$ is the voltage at the interposed membrane structure 112 (in case of a dual backplate configuration). Furthermore, the term "$\text{gap}_{up}$" is the distance between the membrane 112 and the first counter electrode 114 and the term "$\text{gap}_{down}$" is the distance between the membrane structure 112 and the second counter electrode structure 114-1.

The same assumptions are correspondingly applicable to a MEMS sound transducer 110 in a "sealed" dual membrane (SDM) configuration.

In the microphone mode, both electrostatic forces are balanced, i.e. $V_{MEM}=V_{MIC}$, and $V_{up}=V_{down}=V_{sens}$, and also in the presence of a DC configuration, i.e. DC signals (DC=direct current). Consequently, the membrane structure 112 is only moved by incident sound pressure, wherein the amplitude of deflection of the membrane structure 112 depends on the incident sound pressure level (SPL).

According to embodiments, for an ultrasound emission of the MEMS sound transducer 110, AC voltages (AC=alternating current) can be superimposed to drive the membrane structure 112 electrostatically, however, with respect to the actuation voltage it is referred to that:

(1.) with an actuation voltage below the pull-in voltage, a resulting non-linearity causes moderate to high THD (total harmonic distortion) and SPL (sound pressure levels), and (2.) with an actuation voltage above pull-in voltage, a maximum SPL is reached, but also a maximum THD is effected.

However, the MEMS device 100 according to the present embodiment allows using a differential driving voltage for ultrasound actuation of the MEMS sound transducer 110, wherein the actuation signal may be internally provided by the control circuitry 120 which may be implemented as a part of the ASIC of the MEMS device 100. Based on a differential driving voltage for ultrasound emission, the membrane 112 (in a dual backplate configuration) moves from a top pull-in condition to a bottom pull-in condition.

Figure 4:
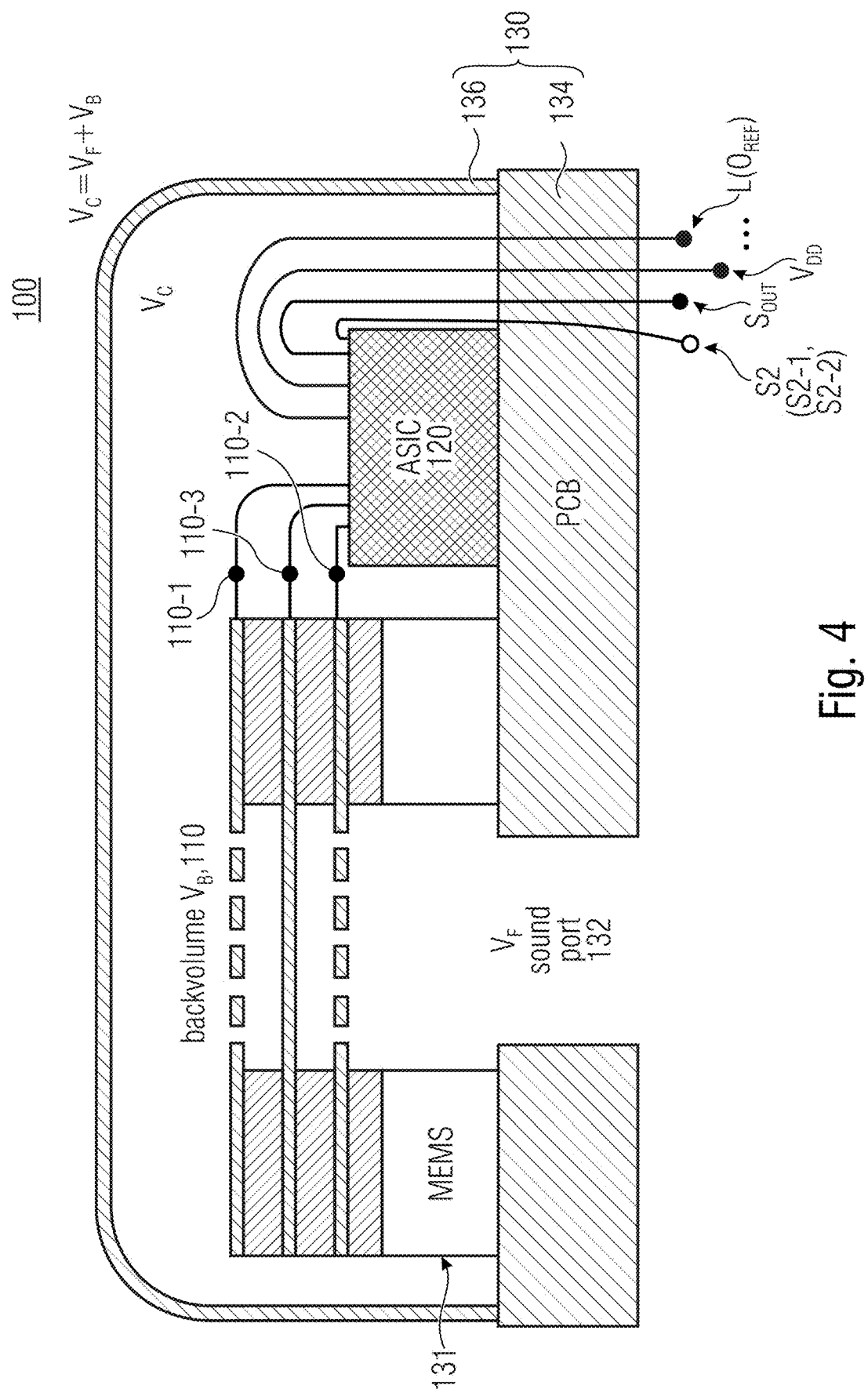
FIG. 4 shows a schematic cross-sectional view of the MEMS device in a packaged configuration according to an embodiment.

FIG. 4 shows a schematic cross-sectional view of the MEMS device 100 having the MEMS sound transducer 110 and the control circuitry 120 (the ASIC or at least a part of the ASIC) in a packaged (housed) configuration according to an embodiment. The MEMS sound transducer 110 has a first, second and third connection terminal 110-1, 110-2, 110-3. As shown in FIG. 4, the MEMS device 100 may be arranged in a housing 130 having an interior volume $V_C$, wherein the housing 130 has an access opening or sound port 132 to the interior volume $V_C$ of the MEMS device 100. The MEMS sound transducer 110 is arranged in the housing 130, for example, adjacent to the sound opening 132. The housing 130 may then comprise, for example, a substrate 134 and an optional cap element 136, which can be at least partially or completely electrically conductive. In an exemplary arrangement, the MEMS sound transducer 110 (MEMS microphone) can subdivide the interior volume $V_C$ into a front volume $V_F$ and a back volume $V_B$, wherein the front volume $V_F$ is situated in the region between the sound port 132 and the MEMS microphone 110, and wherein the back volume $V_B$ is situated on the opposite side of the MEMS sound transducer 110 with respect thereto in the interior volume $V_C$ of the housing 130. In this context, reference is made to the exemplary illustration of the different MEMS sound transducer arrangements in FIGS. 3a-3c, which illustrate different exemplary embodiments of the MEMS sound transducer or MEMS microphone 110.

According to an embodiment, the control signal S2 may be provided from an external circuit element and/or processing device to the control circuitry 120 or may be generated by the control circuitry 120. According to a further embodiment, the first control signal component S2-1 and a second signal component S2-2 may be provided from an external circuit element and/or processing device to the control circuitry 120, wherein the control circuitry 120 generates the control signal S2 and provides the control signal S2 to the switching arrangement 126.

According to an embodiment, the control circuitry 120 may an ASIC (ASIC=application specific integrated circuit) or may be part of an ASIC of the MEMS device 100 for providing an integrated on-chip implementation of the signal generation (e.g., the control signal and high-level supply signal generation) and for controlling the operations modes of the MEMS sound transducer 110. As exemplarily shown in FIG. 4, the control circuitry 120 (ASIC) may be arranged to receive the control signal S2 or the control signal components S2-1, S2-2, the common supply signal or voltage $V_{DD}$, and a reference potential $V_{ref}$, e.g. ground potential, and to provide the output signal $S_{OUT}$.

Figure 5A:
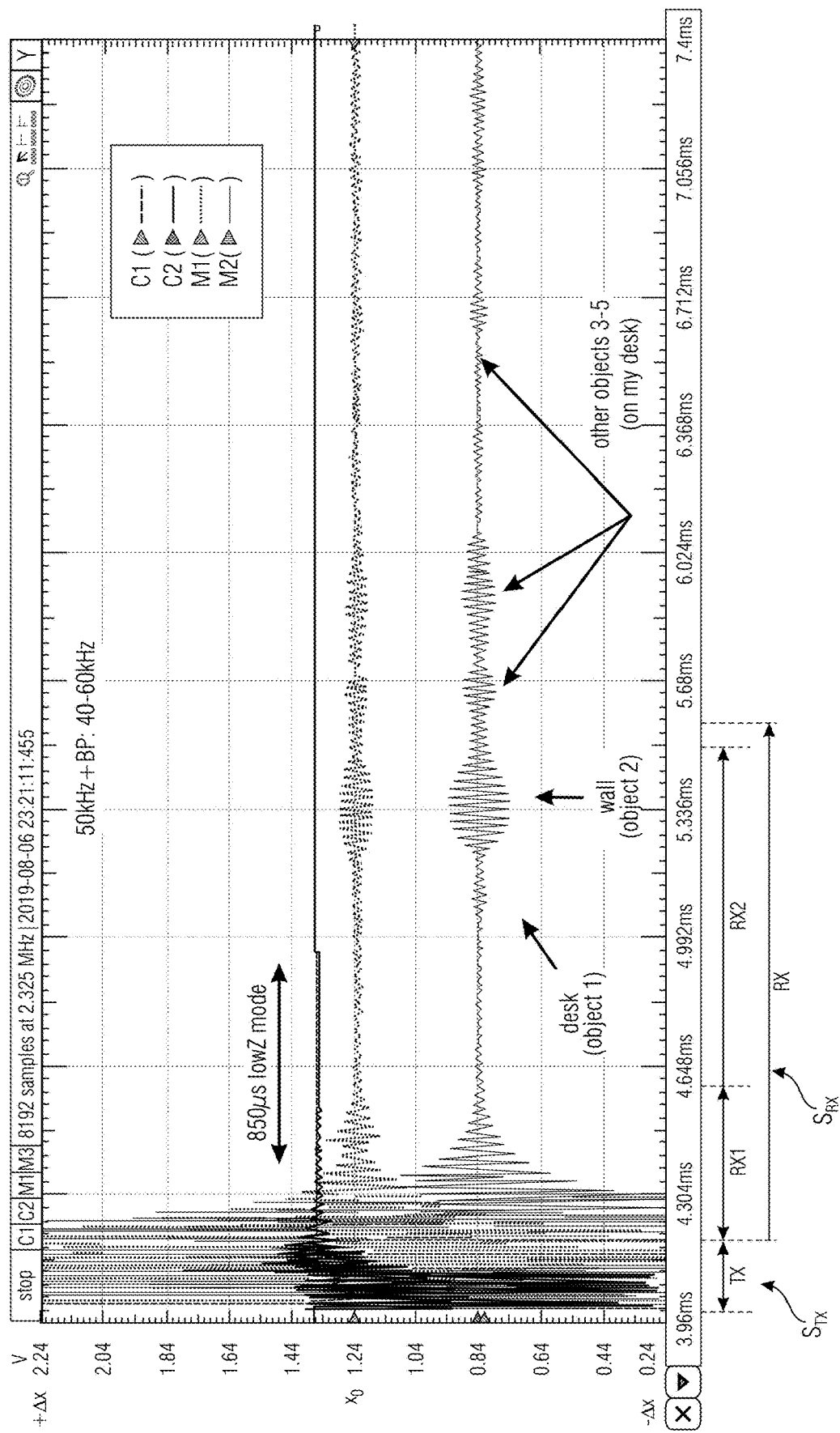
FIGS. 5a-5b show exemplary illustrations of the time courses of the ultrasonic pulses/signals transmitted and the echo signals received and sensed from the MEMS sound transducer, e.g. for object detection, according to an environment.
Figure 5B:
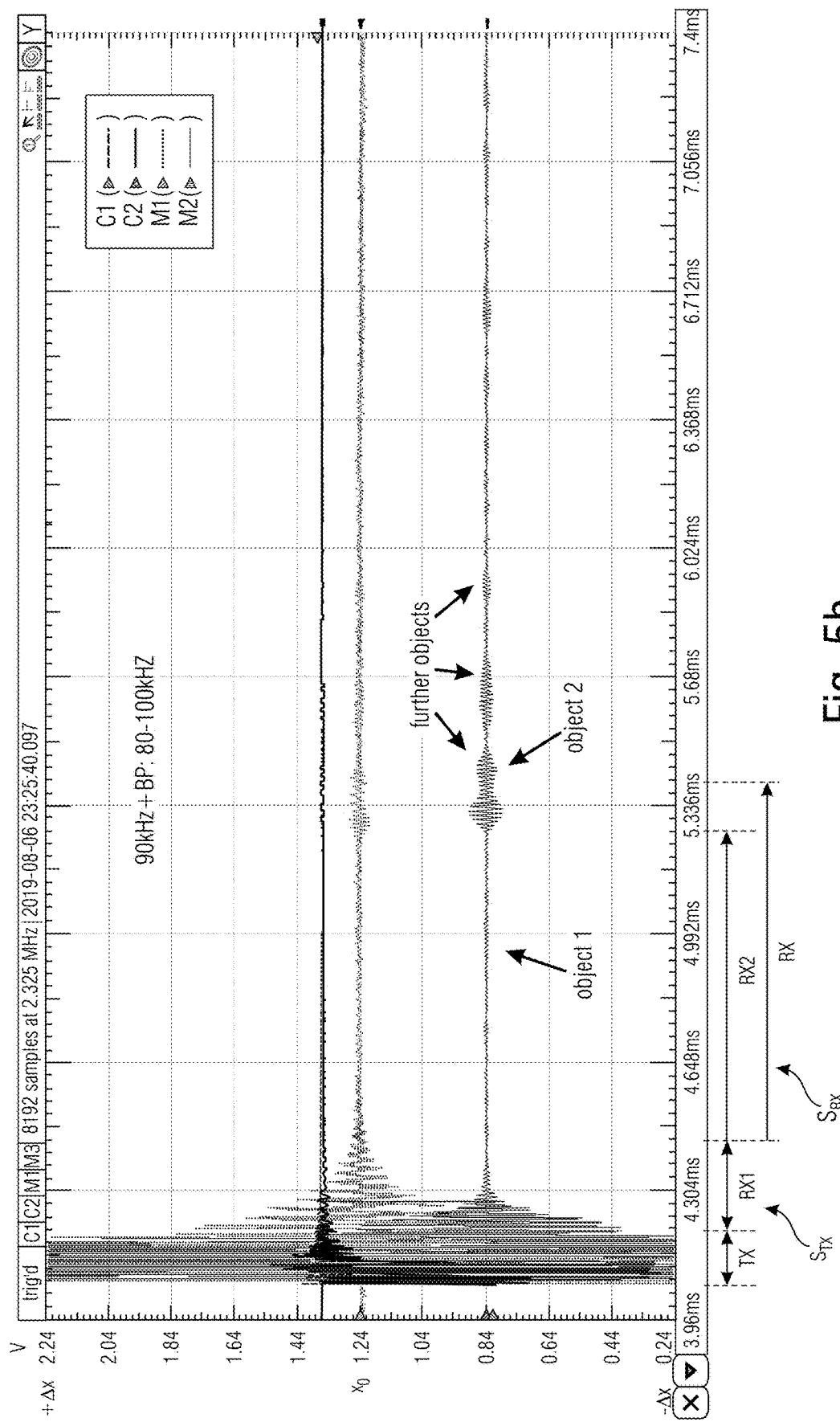

FIGS. 5a-5b show exemplary illustrations of the time course of the ultrasonic pulses/signals $S_{TX}$ transmitted from the MEMS sound transducer 110 and the received signals (echo signals) reflected from objects (to be detected) and sensed/measured from the MEMS sound transducer 110.

FIG. 5a shows a transmitted ultrasonic signal with a frequency of about 50 kHz with a reception bandpass filter for a bandpass frequency range between 40 and 60 kHz. FIG. 3b shows the resulting transmission and reception signals for a 90 kHz ultrasonic signals with a reception bandpass filter for a bandpass frequency range between 80 and 100 kHz.

FIGS. 5a-5b exemplarily show the signal profile of an ultrasonic transmission signal $S_{TX}$ and the signal profile temporarily offset with respect thereto of an ultrasonic reception signal $S_{RX}$ of the MEMS sound transducer 110. As shown in FIGS. 5a-5b, during a first duration (time interval), the ultrasonic pattern P having the ultrasonic frequency is applied to the MEMS sound transducer 110. This is referred to as loudspeaker activation pulse (speaker actuation pulse). The direct reaction of the MEMS sound transducer 110 to the ultrasonic transmission pulse occurs in the form of a strong oscillating excitation of the MEMS sound transducer 110, which is also referred as "ringing". When the loudspeaker activation pulse P is ended, this "ringing" decays relatively rapidly during the following time interval $S_{RX1}$. The ultrasonic reception signal of the MEMS sound transducer 110, i.e., the reflection echo signal, can then be detected and read out during the following time interval $S_{RX2}$, i.e. when the ringing is sufficiently decreased.

As shown in FIGS. 5a-5b, the echo signals can be associated to different objects in the range of the ultrasonic transmission signal depending on the arrival time of the respective echo signal. The nearer the object is located, the earlier the echo signal arrives at the MEMS sound transducer 110. Based on the time interval (run time) until reception of the echo signal, the distance of the respective object is derivable.

The duration of the excited "ringing" of the MEMS sound transducer 110 on account of the ultrasonic transmission signal (ultrasonic actuation pulses) predefines the minimum distance that can be detected by the MEMS sound transducer 110 during the ultrasonic reception operation (receive mode), i.e., as soon as the undesired excitation of the MEMS sound transducer 110 has decayed to a sufficient extent, the acoustic signal can be reliably detected. The time duration for the ringing, which corresponds to the low sensitivity region during the receive mode of FIG. 2, can lie e.g., in a range of 0.1 to 0.5 ms, such that the minimum propagation distance for the ultrasonic signal can be in the order of a few centimeters, for example 3 to 15 cm, in order to be able to detect the reflected ultrasonic reception signal.

FIGS. 5a-5b describe different use cases at different frequencies, which represent, for example, different resonance frequencies of the MEMS sound transducer 110. Different resonances can lead to a different directivity of the MEMS sound transducer 110. Furthermore, the recovery periods of the MEMS sound transducer 110 can be changed or be set by the ASIC 120 due to different resonance frequencies. A higher frequency may lead to a shorter mechanical recovery. As shown in the lower figure of FIG. 5b, an increased frequency of the control signal S2 (e.g., matched to a resonance frequency of the MEMS sound transducer 110) can result in a shorter excitation period TX, which can also lead to shorter "ringing" of the MEMS microphone 110.

In the following, exemplary implementations of the MEMS device 100 and, in particular, different exemplary implementations of the supply signal provider 122 and the switching arrangement 126 of the control circuitry 120 are explained in detail.

Figure 6:
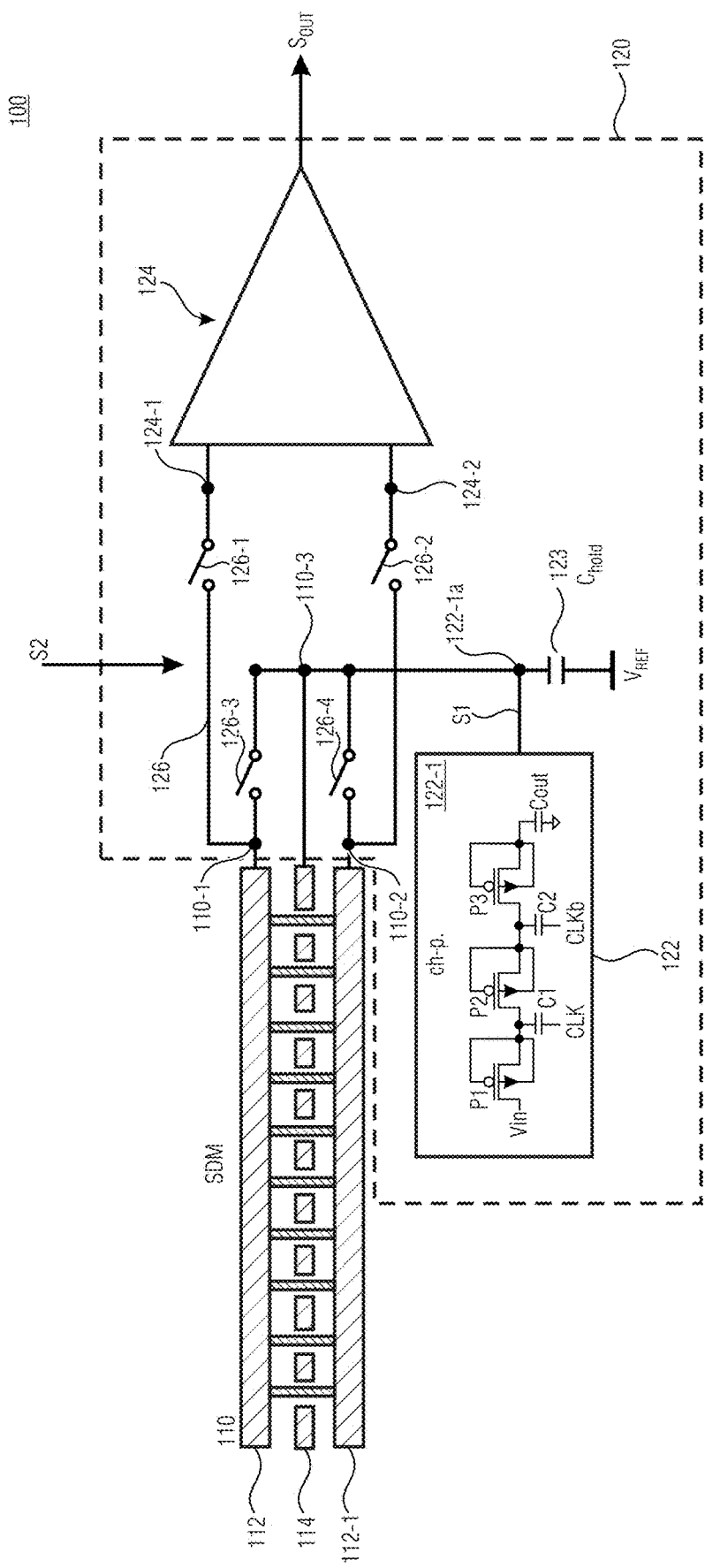
FIG. 6 shows a schematic cross-sectional view of the MEMS sound transducer together with a schematic block diagram of the control circuitry of the MEMS device in a differential excitation and read-out configuration of the MEMS sound transducer according to an embodiment.

FIG. 6 shows a schematic view of the MEMS device 100 with a schematic cross-sectional view of the MEMS sound transducer 110 together with a schematic block diagram of the control circuitry 120 in a differential excitation and read-out configuration of the MEMS sound transducer 110 according to an embodiment.

As shown in FIG. 6, the MEMS device 100 comprises the MEMS sound transducer 110 and the control circuitry 120. As exemplarily shown in FIG. 6, the MEMS sound transducer 110 is a dual membrane microphone (or a sealed dual membrane microphone), which can be differentially actuated with the ultrasonic actuation signal P of the control signal S2 and differentially read out. The following evaluations are equally applicable to a MEMS sound transducer 110 in a dual backplate configuration which can also be differentially actuated and differentially read out.

As shown in FIG. 6, the supply signal provider 122 for providing a high-level supply signal S1 may be configured to provide the high-level supply signal in a low-ohmic configuration, wherein the voltage level V1 of the high-level supply signal S1 is higher than a common supply signal $V_{DD}$ of the MEMS device 100.

Typical (absolute) voltage values V1 of the high-level supply signal S1 may be in a voltage between 7 and 16 V. Typical (absolute) voltage values $V_{DD}$ of the common supply signal $S_{DD}$ may be in a voltage between 1 and 5 V. The voltage values $V_{DD}$ may form the to the supply voltage of the ASIC 120 (=the control circuitry). Thus, typical values for the voltage $V_{DD}$ may be 1.8V for a digital control circuitry and 2.75V for analog control circuitry with allowed +−10% variations, for example.

To be more specific, the voltage values V1 may depend on the specific MEMS device wherein lower voltages and considerably higher voltages are also possible. The voltage V1 needs to be high enough to bring the sensor 110 (the MEMS sound transducer) to its maximum displacement at the interesting frequencies of excitation.

According to an embodiment, the supply signal provider 122 may comprise a charge pump arrangement 122-1 (=ultrasonic send charge pump) for providing the high-level supply signal S1 to the MEMS sound transducer 110.

According to a further embodiment, the supply signal provider 122 may comprise a hold capacitor 123 for storing the high-level supply signal S1 and for providing the high-level supply signal S1 during the ultrasonic transmission mode to the MEMS sound transducer 110. The supply signal provider 122 may be further configured to charge the hold capacitor 123 during the sense mode with the high-level supply signal S1. During the sense mode, the switching arrangement 126 is configured to decouple the supply signal provider 122 and the hold capacitor 123 from the MEMS sound transducer 110 and the read-out circuitry 124.

According to an embodiment, the switching arrangement 126 comprises (at least) four switches 126-1, ..., 126-4 for the differential excitation and differential read-out configuration of the MEMS sound transducer 110 for alternately coupling the high-level supply signal V1 of the supply signal provider 122 to the MEMS sound transducer 110 during the ultrasonic transmission mode TX.

Thus, the switching arrangement 126 is connected between the MEMS sound transducer 110, the supply signal provider 122 and the read-out circuitry 124 for selectively connecting the MEMS sound transducer 110 to the supply signal provider 122 during the ultrasonic transmission mode TX, and for selectively connecting the acoustic output signal $S_{OUT}$ of the MEMS sound transducer 110 to the read-out circuitry 124 during the sense mode RX.

In the first condition TX of the control signal S2, which enables the transmission mode TX of the MEMS sound transducer 110, the ultrasonic actuation pattern P of the control signal S2 triggers the switching arrangement 126 for alternately coupling the high-level supply signal S1 to the first and second terminal 110-1, 110-2 of the MEMS sound transducer 110, wherein the switching arrangement 126 electrically disconnects the MEMS sound transducer 110 from the read-out circuitry 124.

In the second condition RX of the control signal S2, which enables the sense mode (=reception mode) of the MEMS sound transducer 110, the switching arrangement 122 electrically disconnects the MEMS sound transducer 110 from the supply signal provider 122 and electrically connects the acoustic output signal $S_{OUT}$ of the MEMS sound transducer 110 to the read-out circuitry 124.

According to an embodiment, the read-out circuitry 124 may comprise an operational amplifier for receiving and amplifying the acoustic (=audio and/or ultrasonic range) output signal $S_{OUT}$ from the MEMS sound transducer 110, e.g. in a high-impedance read-out configuration.

FIG. 6. shows the MEMS device 100 with a relatively inexpensive and compact "single charge pump concept (configuration)". As exemplarily shown in FIG. 6, the switching arrangement 126 may comprise a first switch element 126-1, which is electrically connected between the terminal (=connection pin) 110-1 of the first membrane structure 112 (110-1=the first terminal of the MEMS sound transducer 110) and the first terminal 124-1 of the read-out circuitry 124, wherein a second switch element 126-2 is electrically connected between the terminal 110-2 of the second membrane element 112-1 (110-2=the second terminal of the MEMS sound transducer 110) and the second terminal 124-2 of the read-out circuitry 124. A third switch element 126-3 is electrically connected between the terminal 110-1 of the first membrane structure 112 and the terminal (=output pin) 122-1a of the supply signal provider 122, wherein a fourth switching element 126-4 is electrically connected between the terminal 110-2 of the second membrane structure 112-1 and the output pin 122-1a of the supply signal provider 122. Furthermore, the hold capacitor 123 is connected between the output terminal 122-1a of the supply signal provider 122 and a reference potential, e.g. ground potential. The terminal 122-1a of the signal provider 122 is electrically connected to the terminal 110-3 of the counter electrode structure 114 (110-3=the third terminal of the MEMS sound transducer no) to provide the high level supply signal V1 to the counter electrode structure 114 of the MEMS sound transducer 110.

The hold capacitor 123 may comprise a capacitance $C_H$ which can be about 20 pF or at least 20 pF, e.g. in a range between 20 pF and 100 pF. Generally, the capacitance $C_H$ of the hold capacitor 123 may be about 10-times of $C_o$ (~10× $C_o$, with $C_o$ is the capacitance of the MEMS sound transducer 110) or may be in a range between 5- and 15-times or 8 and 12-times of $C_o$. Generally, the capacitance $C_H$ of the hold capacitor 123 may depend on the capacitance $C_o$ of the MEMS sound transducer 110 and on the number of excitation cycles needed versus the recovery time between two excitations. Moreover, the switch elements have the capability of switching high-level signals, i.e. to reliable block or conduct the high-level signals V1 based on the adjusted operation condition. According to an embodiment, the switching arrangement 122 may comprise PMOS switches 126-3, 126-4 between the supply signal provider 122 and the MEMS sound transducer 110, and NMOS switches 126-1, 126-2 between the MEMS sound transducer 110 and the read-out circuitry 124.

In the following, an exemplary arrangement and functionality of the blocks of the MEMS device 100 is described.

The differential implementation includes four high-voltage switches 126-1, ..., 126-4 at the input of the MEMS interface, i.e. at the terminals 110-1, 110-2, 110-3 of the MEMS sound transducer 110, that switch at ultrasound frequency during the send mode TX and bringing the two membranes 112, 112-1 of the MEMS sound transducer 110 to pull-in alternatively. The on-chip ultrasound charge-pump 122-1 plus hold capacitor 123 deliver the excitation voltage S1 that is alternatively connected to the two sides 112, 112-1 of the MEMS sound transducer. The excitation mode TX is followed by a recovery period RX1 in which the MEMS interface is low-ohmic, the length of such period RX1 is fixed but can also be made adjustable, as the audio sensitivity of the microphone is reduced during this period. The resulting choice of the length of the recovery period RX1 depends on the distances to be covered by the ultrasound signal required by the application, usually a few cm to about 1 m.

While in sensing mode RX the ultrasonic charge-pump 122-1 loads the hold capacitor 123 for the following excitation period, in this phase, both components 122, 123 are decoupled from the rest of the circuit by steadily opening the relatively high-voltage PMOS switches 126-3, 126-4. Still during the sense mode RX, the signal path is re-established by steadily closing the two high-voltage NMOS switches 1126-1, 126-2, which connect the MEMS sound transducer 110 to the read-out path 124.

According to a further embodiment, the charge-pump 122-1 (as the supply signal provider) used for excitation of the MEMS sound transducer 110 can be substituted by another circuit block that is able to generate the low-ohmic high voltages V1 (>10V). This could provide to a potential extension of the duration of the excitation period, if the designed high-voltage generator is able to drive the MEMS-load efficiently and with a low ohmic-coupling.

The MEMS device 100 with MEMS sound transducer 110 in a differential excitation and read-out configuration using internal actuation signals provides a number of technical effects:

high transmitted power due to differential excitation;
low THD (total harmonic distortion) and high SNR (signal-to-noise ratio) performance in audio receive due to differential audio operation;
internal devices are protected from actuation signals with respect to ESD events,
a low parasitic capacitance at the excitation node(s), and
an integrated on-chip implementation of the signal generation for controlling the operations modes of the MEMS sound transducer.

The above evaluations of a MEMS sound transducer 110 in a dual membrane configuration are equally applicable to a MEMS sound transducer 110 in a dual backplate configuration, wherein the first (top) counter electrode structure 114 is associated to the first terminal 110-1 and the second (bottom) counter electrode structure 114-1 is associated to the second terminal 110-2, and wherein the membrane structure 112 is associated to the third terminal 110-3. Thus, the control circuitry 120 can equally couple the supply signal provider 122 to the MEMS sound transducer 110 using the same terminals 110-1, 110-2, 110-3, i.e. in the dual membrane configuration or in the dual backplate configuration, wherein the same technical effects of the MEMS device 100 can be achieved during the operation with the control circuitry 120.

In the following, a number of different possible implementations of the functional blocks of the MEMS device 100 are exemplarily described.

In the present description of embodiments, the same or similar elements having the same structure and/or function are provided with the same reference numbers or the same name, wherein a detailed description of such elements will not be repeated for every embodiment. Thus, the above description with respect to FIG. 6 is equally applicable to the further embodiments as described below. In the following description, essentially the differences, e.g. additional, changed or replaced elements, to the embodiment as shown in FIG. 6 and the technical effect(s) resulting therefrom are discussed in detail.

FIGS. 7a-7b show a schematic view of the MEMS device 100 with a schematic cross-sectional view of the MEMS sound transducer 110 together with a schematic block diagram of the control circuitry 120 of the MEMS device 100 in a differential excitation and read-out configuration of the MEMS sound transducer 110 according to a further embodiment.

As exemplarily shown in FIGS. 7a-7b, the MEMS sound transducer 110 is a dual membrane microphone (or a sealed dual membrane microphone), which can be differentially actuated with the ultrasonic actuation signal P and differentially read out. The following evaluations are equally applicable to a MEMS sound transducer 110 in a dual backplate configuration which can also be differentially actuated and differentially read out.

The switching arrangement 126 is connected between the MEMS sound transducer 110, the supply signal provider 122 and the read-out circuitry 124 for selectively connecting the MEMS sound transducer 110 to the supply signal provider 122 during the ultrasonic transmission mode TX, and for selectively connecting the acoustic output signal $S_{OUT}$ of the MEMS sound transducer 110 to the read-out circuitry 124 during the sense mode RX.

Thus, FIGS. 7a-7b show the MEMS device 100 with a "mode-dedicated charge pump concept/configuration". According to the embodiment of FIGS. 7a-7b the supply signal provider 122 comprises a charge pump arrangement 122-1 for providing the high-level supply signal S1 to the MEMS sound transducer 110, wherein the voltage level V1 of the high-level supply signal S1 is higher than a common supply signal $V_{DD}$ of the MEMS device 100.

Moreover, the supply signal provider 122 of the MEMS device 100 comprises a further charge pump arrangement 122-2, wherein the further charge pump arrangement 122-2 is configured to provide a further high-level supply signal S1', e.g. during the sense mode RX to the MEMS sound transducer 110, and wherein the charge pump arrangement 122-1 of the supply signal provider 122 is configured to provide the high-level supply signal S1 during the transmission mode TX to the MEMS sound transducer 110, i.e. alternately to the first and second terminal 110-1, 110-2 of the MEMS sound transducer 110.

Typical (absolute) voltage values V1 of the high-level supply signal S1 may be in a voltage between 7 and 16 V. Typical (absolute) voltage values V1' of the further high-level supply signal S1' may be in a voltage between 7 and 16 V. Typical (absolute) voltage values $V_{DD}$ of the common supply signal $S_{DD}$ may be in a voltage between 1 and 5 V. The voltage values $V_{DD}$ may form the to the supply voltage of the ASIC 120 (the control circuitry). Thus, typical values for the voltage $V_{DD}$ may be 1.8V for a digital control circuitry and 2.75V for analog control circuitry with allowed +−10% variations, for example.

To be more specific, the voltage values V1 may depend on the specific MEMS device (the MEMS sound transducer 110) wherein considerably lower voltages and considerably higher voltages are also possible. The voltage V1 needs to be high enough to bring the MEMS sound transducer 110 to its maximum displacement at the interesting frequencies of excitation.

According to an embodiment, the high-level voltages V1, V1' may be chosen to be equal or essentially equal so that the resulting electrostatic forces are zero or essentially zero on that (voltage supplied) side of the MEMS sound transducer 110 when the high-level voltage V1 is connected.

Furthermore, the high-level voltage V1 may indicate or define the useful range of high-level voltage V1', as the high-level voltage V1' may be chosen to comprise a voltage value which is by some (e.g., 2, 3 or 4) Volts above the voltage value of the high-level voltage V1 to account also for the discharging of the hold capacitor 123 ($C_H$).

As exemplarily shown in FIGS. 7a-7b, the switching arrangement 126 may comprise the first switch element 126-1, which is electrically connected between the terminal 110-1 of the first membrane structure 112 and the first terminal 124-1 of the read-out circuitry 124, wherein a second switch element 126-2 is electrically connected between the terminal 110-2 of the second membrane element 112-1 and the second terminal 124-2 of the read-out circuitry 124. A third switch element 126-3 is electrically connected between the terminal 110-1 of the first membrane structure 112 and the output terminal 122-1a of the supply signal provider 122 (of the first charge pump arrangement 122-1), wherein a fourth switching element 126-4 is electrically connected between the terminal 110-2 of the second membrane structure 112-1 and the output terminal 122-1a of the supply signal provider 122.

Furthermore, the hold capacitor 123 is connected between the output terminal 122-1a of the supply signal provider 122 and a reference potential, e.g. ground potential.

Thus, the MEMS device 100 of FIGS. 7a-7b differs from the MEMS device of FIG. 6 in that the MEMS device of FIGS. 7a-7b comprises the further signal provider 122-2, e.g. in form of a further charge pump arrangement 122-2, wherein the output terminal 122-2a of the further signal provider 122-2 is electrically connected to the terminal 110-3 of the counter electrode structure 114 to provide the further high level supply signal V1' to the terminal 110-3 of the counter electrode structure 114 of the MEMS sound transducer 110, e.g. during the sense mode of the MEMS sound transducer 110.

The implementation of the MEMS device according to FIGS. 7a-7b provides a high audio performance and a fast switching between the two modes RX, TX, wherein a considerable discharge of the hold capacitor 123 can be avoided during the transmission mode TX. Moreover, a low parasitic capacitance at the excitation node may be achieved.

According to an embodiment, the switching conditions (phases) φ1, φ2 in FIGS. 7a-7b indicate that, during an excitation mode, the two phases φ1, φ2 follow the timing of the excitation signal and connect alternatively each one of the MEMS sides (i.e., alternatively the first membrane structure 112 and the further (second) membrane structure 112-1 "or" alternatively the first counter-electrode structure 114 and the further (second) counter-electrode structure 114-1) to the reference signal (reference voltage) of the amplifier 124 (=read-out circuitry) or to the high voltage V1 provided by the charge pump arrangement 122. In this manner, each side experiences respectively high or almost-zero electrostatic forces.

FIG. 7b shows the schematic cross-sectional view of the MEMS sound transducer of FIG. 7a together with a schematic implementation of bypass switch(es) according to an embodiment. The schematic implementation of the bypass switch(es) as exemplarily shown in FIG. 7b, is correspondingly applicable to all embodiments of the present description.

The MEMS device 100 of FIG. 7b differs from the MEMS device of FIG. 7a in that the MEMS device of FIG. 7b comprises the further bypass switches (bypass switch arrangement) 140, 142 and 144 and a further hold capacitor 123-1 at the terminal 110-3 of the counter electrode structure 114.

As shown in FIG. 7b, the first bypass switch arrangement 140 is electrically connected between the first terminal 124-1 of the read-out circuitry 124 and ground potential (reference potential). The first bypass switch arrangement 140 comprises a voltage source 140-1 and a high impedance element 140-2 (high-resistance element) in a serial connection. The serial connection of the voltage source 140-1 and the high impedance element 140-2 is coupled between the first terminal 124-1 of the read-out circuitry 124 and the ground terminal. Furthermore, a first switching element 140-3 is parallel connected to the voltage source 140-1, and a second switching element 140-4 is parallel connected to the high-impedance element 140-2. The voltage source 140-1 may provide an amplifier common mode reference voltage, wherein the switching elements 140-3, 140-4 may provide the excitation low-Z-mode switching elements (Z=impedance) of the bypass switch arrangement 140.

The second bypass switch arrangement 142 is electrically connected between the second terminal 124-2 of the read-out circuitry 124 and ground potential. The second bypass switch arrangement 140 comprises a voltage source 142-1 and a high impedance element 142-2 (high-resistance element) in a serial connection. The serial connection of the voltage source 142-1 and the high impedance element 142-2 is coupled between the second terminal 124-2 of the read-out circuitry 124 and the ground terminal. Furthermore, a first switching element 142-3 is parallel connected to the voltage source 142-1, and a second switching element 142-4 is parallel connected to the high-impedance element 142-2. The voltage source 142-1 may provide an amplifier common mode reference voltage, wherein the switching elements 142-3, 142-4 may provide the excitation low-Z-mode switching elements of the bypass switch arrangement 142.

The third bypass switch arrangement 144 comprises a parallel connection of a high-impedance element 144-1 and a switching element 144-2, which are electrically connected between the output terminal 122-2a of the further signal provider 122-2 and the third terminal 110-3 of the counter electrode structure 140. Further, the optional hold capacitor 123-1 is connected between the output terminal 122-2a of the further signal provider 122-2 and ground potential. The switching element 144-2 may provide the excitation low-Z-mode switching elements of the bypass switch arrangement 144.

As already discussed above, the first portion (low sens) RX1 of the sense mode RX following the transmission mode TX forms a recovery period of the MEMS sound transducer 110, wherein the control circuitry 120 may provide a low-ohmic interface during the recovery period by means of the bypass switch arrangements 140, 142, 144. In the low-ohmic recovery mode, the bypass switch arrangements 140, 142, 144 are enabled across the high-ohmic blocks as the ASIC 120 input. During the recovery period RX1, the oscillation of the MEMS microphone 110 will abate or fade away (=ringing), with the MEMS microphone 110 returning to normal sound reception mode. Due to the low-resistance or low-resistance state of the MEMS interface, short time constants can be achieved in order to be able to achieve the receive mode RX as quickly as possible, since the following applies: the shorter the recovery period, the shorter distances can be detected in the ultrasonic mode. The low-ohmic recovery mode enables the bypass switches across the high-ohmic blocks at the ASIC 120 input, for example.

As exemplarily shown in FIG. 7b, the optional hold capacitor 123-1 may be arranged for storing and providing the further high-level supply signal S1', e.g., provided by the further charge pump arrangement 122-2 during the sense mode RX, to the MEMS sound transducer 110.

According to the different embodiments of the present specification, a hold capacitor 123-1 may be arranged at the output terminal 122-2a of the further signal provider 122-2 for storing and providing the further high-level supply signal S1', i.e. the hold capacitor 123-1 may be connected between the output terminal 122-2a of the further signal provider 122-2 and ground potential.

Figure 8:
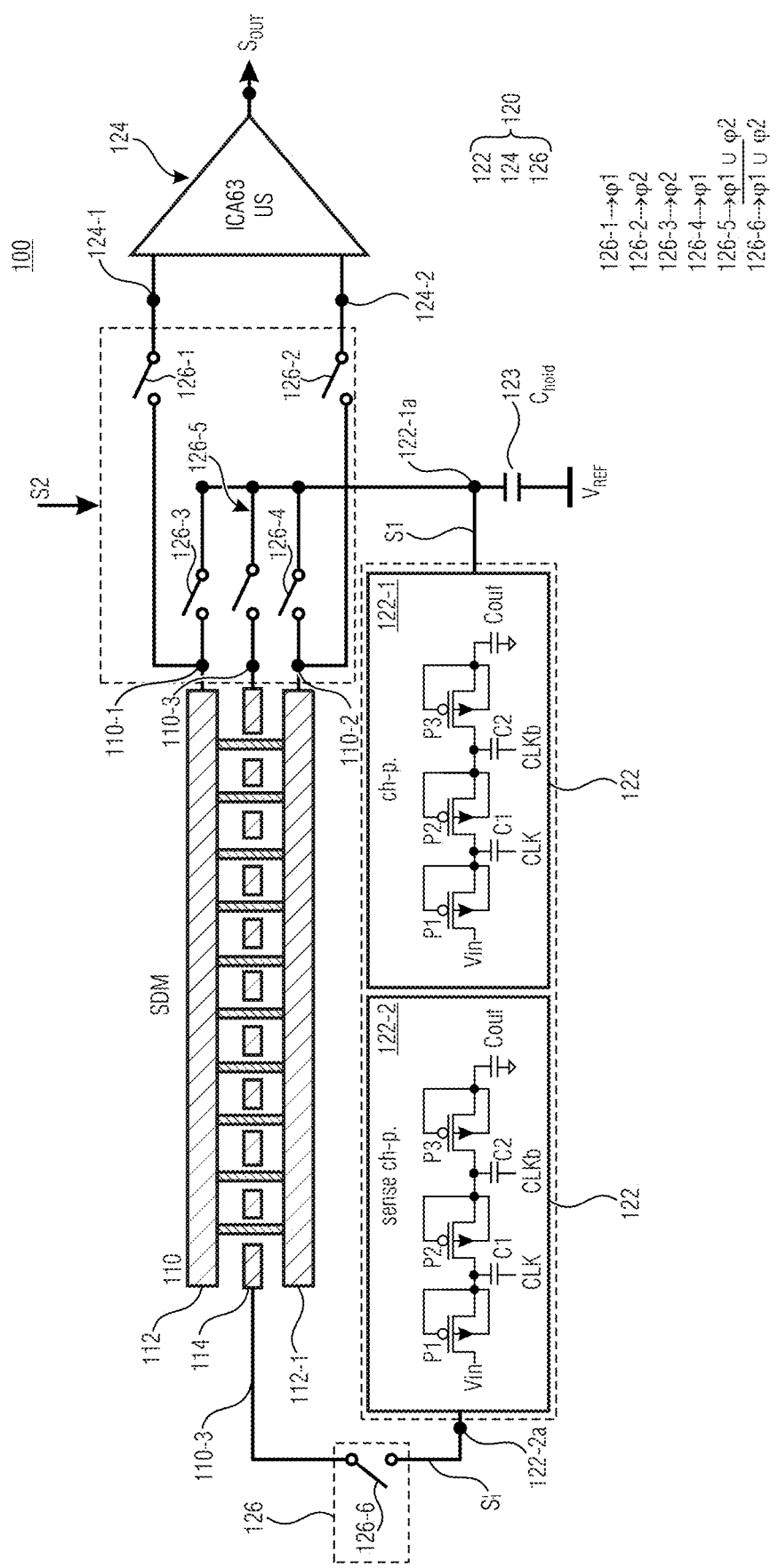
FIG. 8 shows a schematic cross-sectional view of the MEMS sound transducer together with a schematic block diagram of the control circuitry of the MEMS device in a differential excitation and read-out configuration of the MEMS sound transducer according to an embodiment.

FIG. 8 shows a schematic view of the MEMS device 100 with a schematic cross-sectional view of the MEMS sound transducer 110 together with a schematic block diagram of the control circuitry 120 of the MEMS device in a differential excitation and read-out configuration of the MEMS sound transducer according to a further embodiment.

As exemplarily shown in FIG. 8, the MEMS sound transducer 110 is a dual membrane microphone (or a sealed dual membrane microphone), which can be differentially actuated with the ultrasonic actuation signal P and differentially read out. The following evaluations are equally applicable to a MEMS sound transducer 110 in a dual backplate configuration which can also be differentially actuated and differentially read out.

Thus, FIG. 8 also shows the MEMS device 100 with a "mode-dedicated charge pump concept (configuration)". As exemplarily shown in FIG. 8, the switching arrangement 126 may comprise the first switch element 126-1, which is electrically connected between the terminal 110-1 of the first membrane structure 112 and the first terminal 124-1 of the read-out circuitry 124, wherein a second switch element 126-2 is electrically connected between the terminal 110-2 of the second membrane element 112-1 and the second terminal 124-2 of the read-out circuitry 124. A third switch element 126-3 is electrically connected between the terminal 110-1 of the first membrane structure 112 and the output terminal 122-1a of the supply signal provider 122, wherein a fourth switching element 126-4 is electrically connected between the terminal 110-2 of the second membrane structure 112-1 and the output terminal 122-1a of the supply signal provider 122. Furthermore, the hold capacitor 123 is connected between the output terminal 122-1a of the supply signal provider 122 and a reference potential, e.g. ground potential.

When compared to the MEMS device 100 as shown in FIG. 7, the MEMS device 100 of FIG. 8 further comprises a fifth and sixth switching element 126-5, 126-6. The fifth switching element 126-5 is electrically connected between the terminal 110-3 of the counter electrode structure 114 and the output terminal 122-1a of the supply signal provider 122. The sixth switching element 126-6 is electrically connected between the output terminal 122-2a of the further signal provider 122-2 and the terminal 110-3 of the counter electrode structure 114 to provide the further high level supply signal V1' to the terminal 110-3 of the counter electrode structure 114 of the MEMS sound transducer 110, e.g. during the sense mode of the MEMS sound transducer 110.

The implementation of the MEMS device according to FIG. 8 also provides a high audio performance and a fast switching between the two modes RX, TX, wherein a considerable discharge of the hold capacitor 123 can be avoided during the transmission mode TX.

According to an embodiment, the switching conditions (phases) φ1, φ2 in FIG. 8 indicate that, during an excitation mode, the two phases φ1, φ2 follow the timing of the excitation signal and connect alternatively each one of the MEMS sides (i.e., alternatively the first membrane structure 112 and the further (second) membrane structure 112-1 "or" alternatively the first counter-electrode structure 114 and the further (second) counter-electrode structure 114-1) to the reference signal (reference voltage) of the amplifier 124 (=read-out circuitry) or to the high voltage V1 provided by the charge pump arrangement 122.

As exemplarily shown in FIG. 8, the first switching element 126-1 follows the condition φ1, the second switching element 126-2 follows the condition φ2, the third switching element 126-3 follows the condition φ2, the fourth switching element 126-4 follows the condition φ1, the fifth switching element 126-5 follows the condition "φ1 OR φ2" (logic OR), the sixth switching element 126-6 follows the condition "φ1 NOR φ2" (logic NOR). Thus, the sixth switching element 126-6 ensures that the further signal provider 122-2 provides the further high-level supply signal V1' to the terminal 110-3 of the counter electrode structure 114 of the MEMS sound transducer 110 (only) during the sense mode of the MEMS sound transducer 110.

Even if the RX charge pump 122-1 (=the (first) supply voltage provider 122-1) is isolated from the system while transmitting/TX mode), for avoiding the situation that the "$V_{MIC}$" node (at the terminal 110-3) of the MEMS sound transducer 110 would follow the excitation charge-pump node 122-1a during the transmission mode TX, the "$V_{MIC}$" node 110-3 is subject to a strong excitation (at discharge) leading to a bigger drift of the $V_{MIC}$ node and a slower recovery after the excitation that has to be driven by the sense charge pump 122-2. Therefore, in a technology having hi-V MOS switches (hi-V=high-Volt) between two charge pumps (which may be designed as only hi-side or only low-side, i.e. with only one of the two junctions available to stand high voltages), reverse voltages can be avoided which otherwise might damage the devices.

Figure 9:
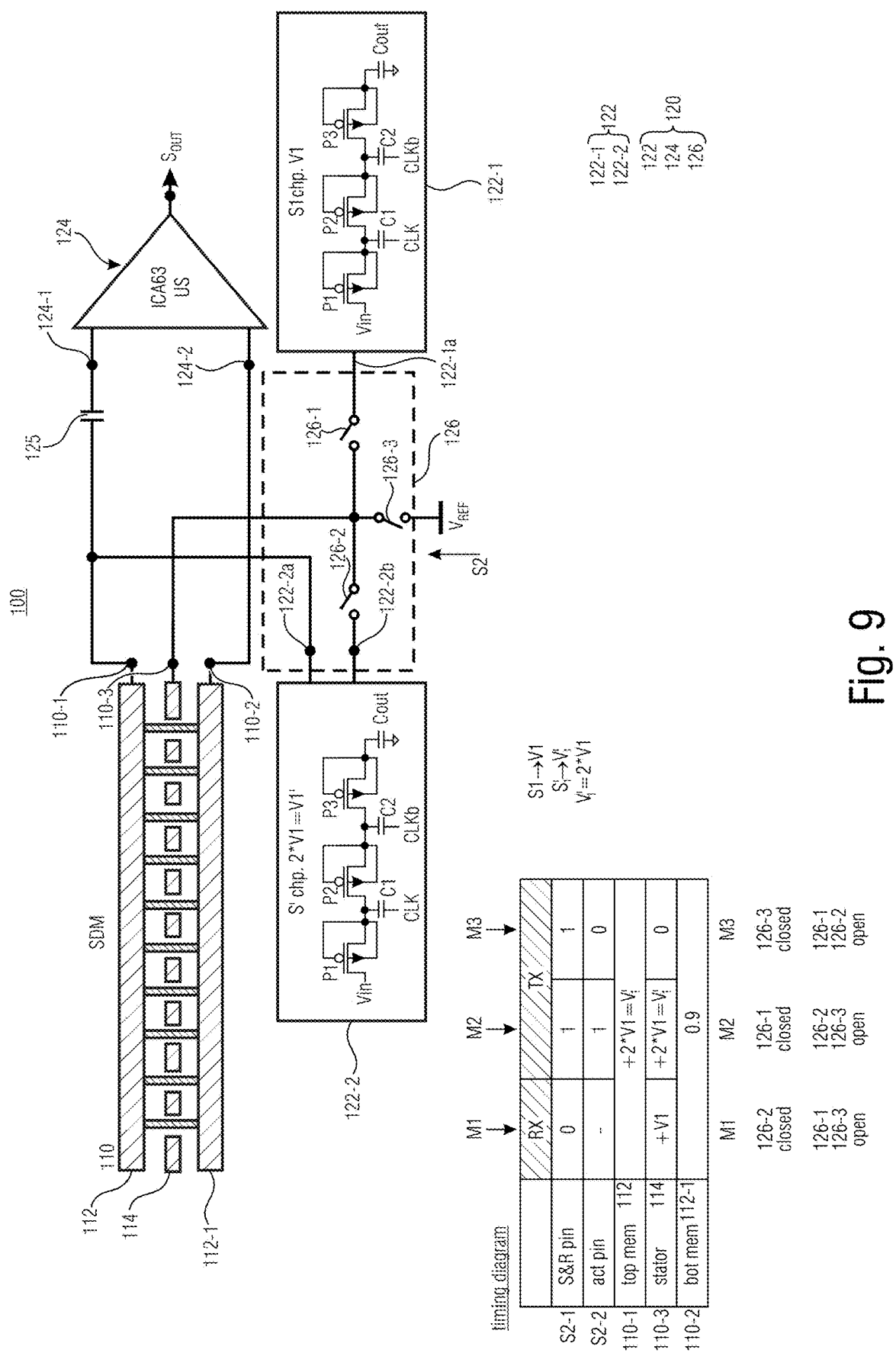
FIG. 9 shows a schematic cross-sectional views of the MEMS sound transducer together with a schematic block diagram of the control circuitry of the MEMS device in a differential excitation and read-out configuration of the MEMS sound transducer according to an embodiment.

FIG. 9 shows a schematic view of the MEMS device 100 with a schematic cross-sectional view of the MEMS sound transducer 110 together with a schematic block diagram of the control circuitry of the MEMS device 120 (in a differential excitation and read-out configuration of the MEMS sound transducer) according to a further embodiment.

As exemplarily shown in FIG. 9, the MEMS sound transducer 110 is a dual membrane microphone (or a sealed dual membrane microphone), which can be differentially actuated with the ultrasonic actuation signal P and differentially read out. The following evaluations are equally applicable to a MEMS sound transducer 110 in a dual backplate configuration which can also be differentially actuated and differentially read out.

The switching arrangement 126 is connected between the MEMS sound transducer 110, the supply signal provider 122 and the read-out circuitry 124 for selectively connecting the MEMS sound transducer 110 to the supply signal provider 122 during the ultrasonic transmission mode TX, and for selectively connecting the acoustic output signal $S_{OUT}$ of the MEMS sound transducer 110 to the read-out circuitry 124 during the sense mode RX.

As exemplarily shown in FIG. 9, a first capacitor 125 (as a DC-blocking and AC-coupling capacitor) is electrically coupled between the first terminal 110-1 of the MEMS sound transducer 110 (=the terminal 110-1 of the first membrane structure 112) and the first terminal 124-1 of the readout circuitry 124. The second terminal 110-2 of the MEMS sound transducer 110 (=the terminal 110-2 of the second membrane structure 112-1) is electrically connected to the second terminal 124-2 of the read out circuitry 124.

A first switch element 126-1 is electrically connected between the third terminal 110-3 of the MEMS sound transducer 110 (=the terminal 110-3 of the backplate structure 114) and the output terminal 122-1a of the (first) supply voltage provider 122-1 (e.g., a first change pump arrangement 122-1). A first terminal 122-2a of a further (second) supply signal provider 122-2 (e.g., a second charge pump arrangement 122-2) is electrically connected to the first terminal 110-1 of the MEMS sound transducer 110 (=the terminal 110-1 of the membrane structure 112). A second switch element 126-2 is electrically connected between a second terminal 122-2b of the further supply signal provider 122-2 and the third terminal 110-3 of the MEMS sound transducer 110 (=the terminal 110-3 of the backplate structure 114). Further, a third switch element 126-3 is electrically connected between the third terminal 110-3 of the MEMS sound transducer 110 and a reference potential, e.g., ground potential.

FIG. 9 further shows a timing diagram of the different conditions of the control signal S2, such as the control signal components S2-1, S2-2, and the associated and resulting signal values (voltage values) at the different elements of the MEMS sound transducer 110.

As shown in FIG. 9, the first charge pump arrangement 122-1 is arranged to provide a high-level supply signal S1 having a voltage value V1, wherein the second charge pump arrangement 122-2 is arranged to provide a further high-level supply signal S1' having a further voltage value V1'. According to an embodiment, the second charge pump arrangement 122-2 is arranged to provide a high-level supply signal S1' having a higher voltage value V1', e.g., a double voltage value V1'=2*V1, when compared to the signal level V1 of the high-level supply signal S1 of the first charge pump arrangement 122-1. Thus, the signal level V1' of the further high-level supply signal S1' may be in a range of 1.5 to 2.5 times higher than the signal level V1 of the high-level supply signal S1, e.g. V1'=1.5 to 2.5*V1 or about V1'=2*V1.

According to the timing diagram of FIG. 9, the first switching element 126-1 is closed (=conducting), and the second and third switching elements 126-1 and 126-3 are open (=non-conducting) during the sense mode RX (=condition M1) with a first (low="0") logical level of the control signal S2 and of the first control signal component S2-1. In the transmission mode TX of the MEMS sound transducer 110, the control signal S2 provides the actuation pattern P which switches with the actuation frequency between the first (low=0) logic level and the second (high=1) logic level. Thus, in the second condition M2, the actuation pattern P (=the control signal S2) has a high logic level, e.g. as the logic AND combination of the high logic level of the first control signal component S2-1 and the high logic level of the second control signal component S2-2, wherein the second switching element 126-2 is closed, and the first and third switching elements 126-1 and 126-3 are open. In the third condition M3, the alternating actuation pattern P (=the control signal S2) has s a low logic level, e.g. as the logic AND combination of the high logic level of the first control signal component S2-1 and the low logic level of the second control signal component S2-2, wherein the third switching element 126-3 is closed, and the first and second switching elements 126-1, 126-2 are open.

The resulting voltage levels during the different operating conditions of the MEMS device 110 are indicated in the timing diagram of FIG. 9.

To be more specific, the first membrane structure 112 comprises during all conditions M1-M3 the voltage to V1' provided by the second charge pump arrangement 122-2. The second membrane structure 112-1 is during all conditions M1-M3 connected with the second input terminal 124-2 of the readout circuitry 124 and comprises, for example, a constant voltage of about 0.9 V or e.g. 0.5-1.5 V. The backplate 114 (stator) comprises during the first condition M1 the voltage V1, during the second condition M2 the voltage V1', and during the third condition M3, the reference potential, e.g., ground potential=0V.

As shown in FIG. 9 the hold capacitor 123 can be omitted, for example, if the high-voltage generators (e.g., the charge-pumps) 122-1, 122-2 have an output that is low-ohmic enough, i.e. is able to drive the involved loads and quickly recover the nodes at the excitation frequencies. Thus, if the series resistance of the supply signal providers 122-1, 122-2 has a sufficiently low value, the supply signal providers 122-1, 122-2 can drive the MEMS nodes 110-1, 110-2, 110-3 at ultra-sound frequencies. Otherwise, the provision of the hold capacitor 123, 123-1 may be necessary to sustain the excitation phase.

Figure 10:
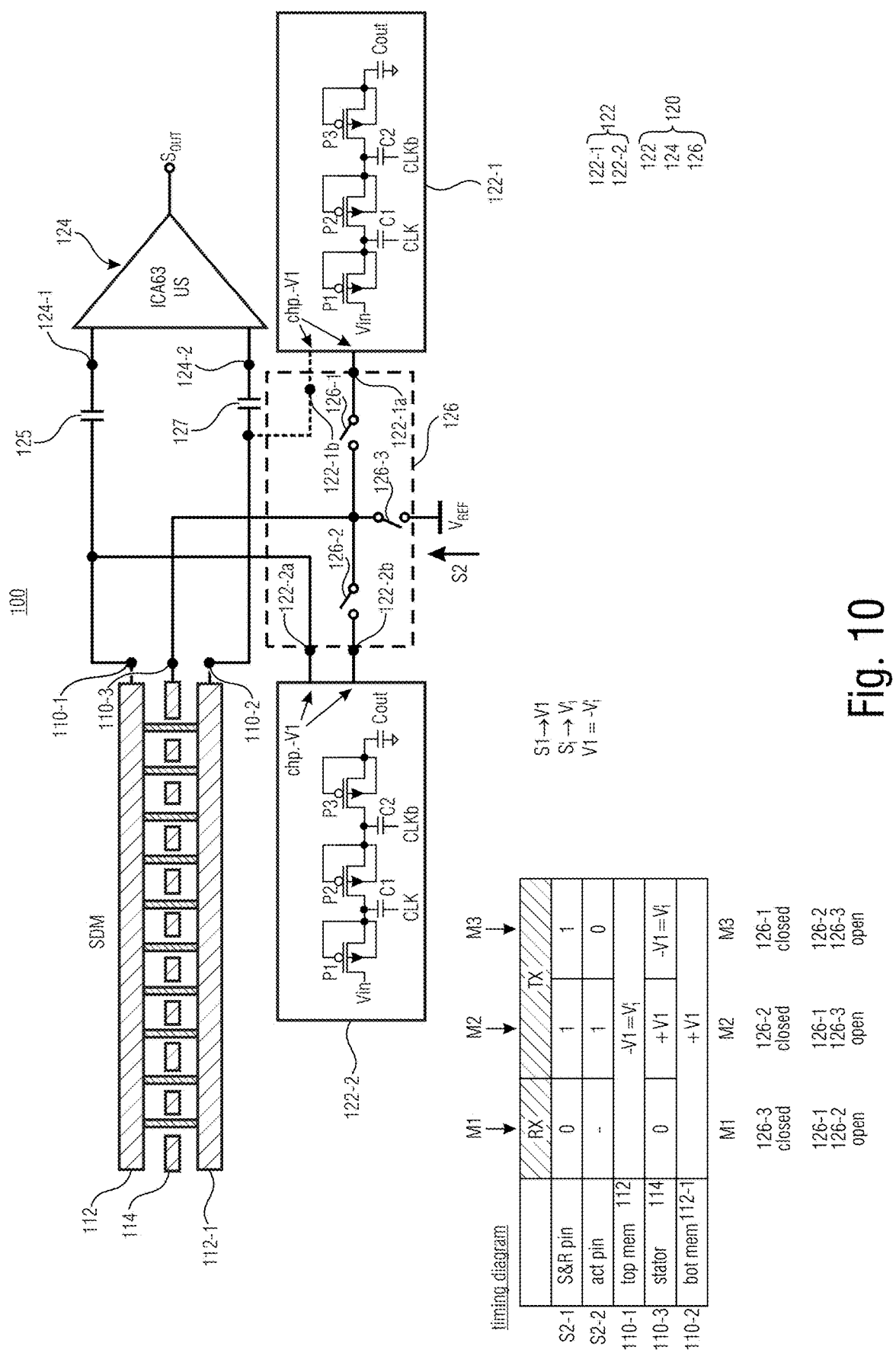
FIG. 10 shows a schematic cross-sectional view of the MEMS sound transducer together with a schematic block diagram of the control circuitry of the MEMS device in a differential excitation and read-out configuration of the MEMS sound transducer according to a further embodiment.

FIG. 10 shows a schematic view of the MEMS device 100 with a schematic cross-sectional view of the MEMS sound transducer together with a schematic block diagram of the control circuitry of the MEMS device (in a differential excitation and read-out configuration of the MEMS sound transducer) according to a further embodiment.

As exemplarily shown in FIG. 10, the MEMS sound transducer 110 is a dual membrane microphone (or a sealed dual membrane microphone), which can be differentially actuated with the ultrasonic actuation signal P and differentially read out. The following evaluations are equally applicable to a MEMS sound transducer 110 in a dual backplate configuration which can also be differentially actuated and differentially read out.

The switching arrangement 126 is connected between the MEMS sound transducer 110, the supply signal provider 122 and the read-out circuitry 124 for selectively connecting the MEMS sound transducer 110 to the supply signal provider 122 during the ultrasonic transmission mode TX, and for selectively connecting the acoustic output signal $S_{OUT}$ of the MEMS sound transducer 110 to the read-out circuitry 124 during the sense mode RX.

As exemplarily shown in FIG. 10, a first capacitor 125 (as a DC-blocking and AC-coupling capacitor) is electrically coupled between the first terminal 110-1 of the MEMS sound transducer 110 (=the terminal 110-1 of the first membrane structure 112) and the first terminal 124-1 of the readout circuitry 124. A second capacitor 127 (as a DC-blocking and AC-coupling capacitor) is electrically coupled between the second terminal 110-2 of the MEMS sound transducer 110 (=the terminal 110-2 of the second membrane structure 112-1) and the second terminal 124-2 of the readout circuitry 124.

A first switching element 126-1 is electrically connected between the third terminal 110-3 of the MEMS sound transducer 110 (=the terminal 110-3 of the backplate structure 114) and the first output terminal 122-1a of the first supply voltage provider 122-1 (e.g., a positive change pump arrangement). A second output terminal 122-1b of the first supply voltage provider 122-1 is electrically connected to the second terminal 110-2 of the MEMS sound transducer 110 (=the terminal 110-2 of the second membrane structure 112-1).

A first output terminal 122-2a of a further (second) supply signal provider 122-2 (e.g., a second negative charge pump arrangement) is electrically connected to the first terminal 110-1 of the MEMS sound transducer 110 (=the terminal 110-1 of the membrane structure 112). A second switching element 126-2 is electrically connected between a second output terminal 122-2a of the further supply signal provider 122-2 and the third terminal 110-3 of the MEMS sound transducer 110 (=the terminal 110-3 of the backplate structure 114). Further, a third switching element 126-3 is electrically connected between the third terminal 110-3 of the MEMS sound transducer 110 and a reference potential, e.g., ground potential.

FIG. 10 further shows a timing diagram of the different conditions of the control signal S2, such as the control signal components S2-1, S2-2, and the associated and resulting signal values (voltage values V1, V1') at the different elements of the MEMS sound transducer 110.

As shown in FIG. 10, the first charge pump arrangement 122-1 is arranged to provide a high-level supply signal S1 having a voltage value V1, wherein the second charge pump arrangement 122-2 is arranged to provide a further high-level supply signal S1' having a further voltage value V1'. According to an embodiment, the second charge pump arrangement 122-2 is arranged to provide a high-level supply signal S1' having a negative voltage value V1', e.g., a voltage value V1'=−V1, when compared to the signal level V1 of the high-level supply signal S1 of the first charge pump arrangement 122-1. Thus, the signal level V1' of the further high-level supply signal S1' may be in a range of V1'=−0.5 to −1.5*V1 or about V1'=−V1.

According to the timing diagram of FIG. 10, the third switching element 126-3 is closed (=conducting), and the first and second switching elements 126-1 and 126-3 are open (=non-conducting) during the sense mode RX (=condition M1). In the second condition M2, the actuation pattern P (=the control signal S2) has a high logic level, wherein the second switching element 126-2 is closed, and the first and third switching elements 126-1 and 126-3 are open. In the third condition M3, the alternating actuation pattern P (=the control signal S2) has s a low logic level wherein the third switching element 126-3 is closed, and the first and second switching elements 126-1, 126-2 are open.

The resulting voltage levels during the different operating conditions of the MEMS device 110 are indicated in the timing diagram of FIG. 10. To be more specific, the first membrane structure 112 comprises during all conditions M1 to M3 the voltage to V1' provided by the second charge pump arrangement 122-2. The second membrane structure 112-1 is during all conditions M1 to M3 connected with the second terminal 122-1b of the first charge pump arrangement 122-1 and comprises, for example, a signal level V1. The backplate 114 (stator) comprises during the first condition M1 the reference voltage, e.g., ground potential=0V, during the second condition M2 the voltage V1, and during the third condition M3, the voltage level V1', e.g., V1'=−V1.

The above evaluations in FIGS. 6 to 10 of a MEMS sound transducer 110 in a dual membrane configuration are equally applicable to a MEMS sound transducer 110 in a dual backplate configuration, wherein the first (top) counter electrode structure 114 comprises the first terminal 110-1 and the second (bottom) counter electrode structure 114-1 comprises a second terminal 110-2, and wherein the membrane structure 112 comprises the third terminal 110-3. Thus, the control circuitry 120 can equally couple the supply signal provider 122 to the MEMS sound transducer 110 using the same terminals 110-1, 110-2, 110-3 i.e., in the dual membrane configuration or in the dual backplate configuration, wherein the same technical effects of the MEMS device 100 can be achieved during the operation with the control circuitry 120.

Figure 11:
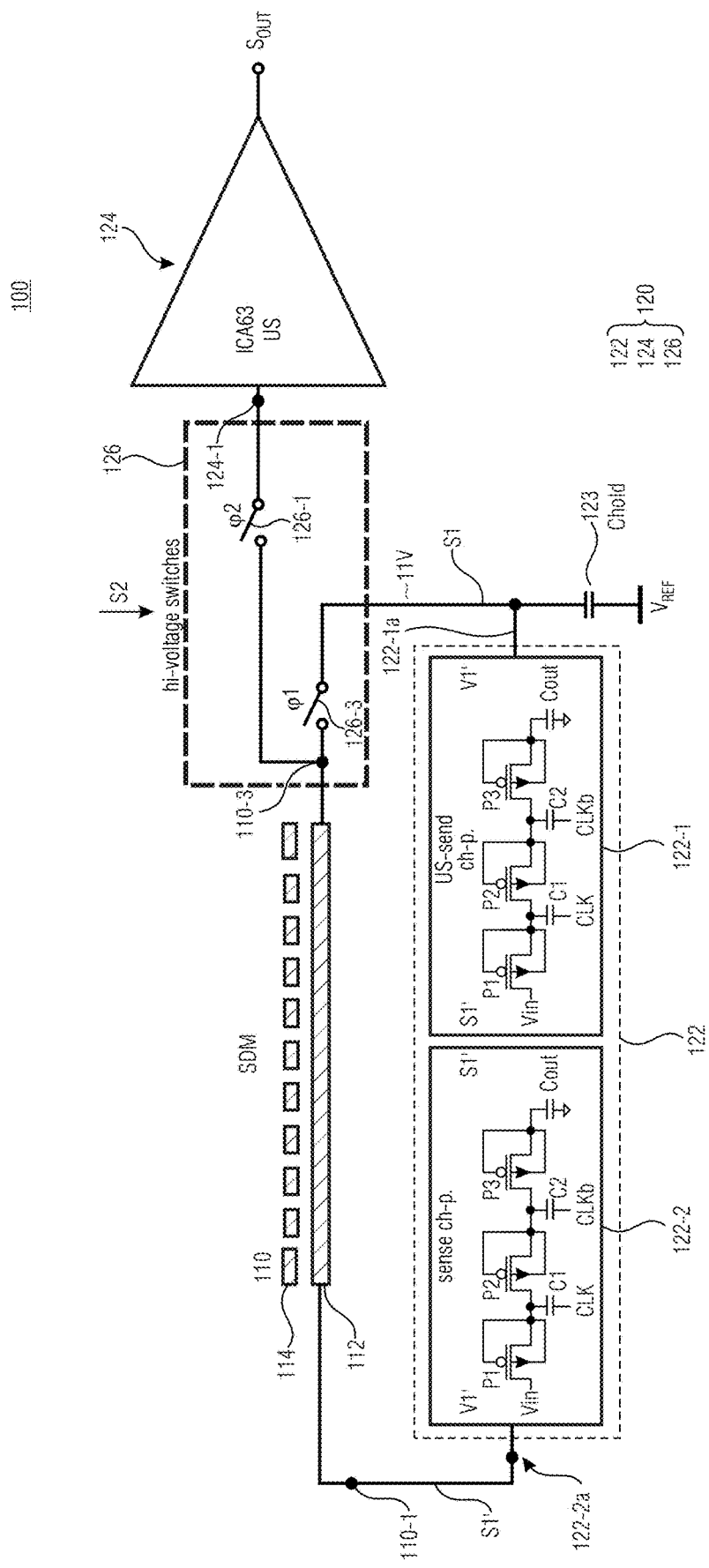
FIG. 11 shows a schematic cross-sectional view of the MEMS sound transducer together with a schematic block diagram of the control circuitry of the MEMS device in a single-ended excitation and read-out configuration of the MEMS sound transducer according to a further embodiment.

FIG. 11 shows a schematic view of the MEMS device 100 with a schematic cross-sectional view of the MEMS sound transducer 110 together with a schematic block diagram of the control circuitry 120 of the MEMS device 100 in a single-ended excitation and read-out configuration of the MEMS sound transducer 110 according to a further embodiment. As exemplarily shown in FIG. 11, the MEMS sound transducer 110 is a single membrane microphone in a single-ended (common mode) ultrasonic actuation and read-out configuration.

The switching arrangement 126 is connected between the MEMS sound transducer 110, the supply signal provider 122 and the read-out circuitry 124 for selectively connecting the MEMS sound transducer 110 to the supply signal provider 122 during the ultrasonic transmission mode TX, and for selectively connecting the acoustic output signal $S_{OUT}$ of the MEMS sound transducer 110 to the read-out circuitry 124 during the sense mode RX.

Thus, FIG. 11 shows the MEMS device 100 with a "mode-dedicated charge pump concept". According to the embodiment of FIG. 11 the supply signal provider 122 comprises a first charge pump arrangement 122-1 for providing the high-level supply signal S1 to the MEMS sound transducer 110, wherein the voltage level V1 of the high-level supply signal S1 is higher than a common supply signal $V_{DD}$ of the MEMS device 100.

Moreover, the MEMS device 100 comprises a further (second) charge pump arrangement 122-2, wherein the further charge pump arrangement 122-2 is configured to provide a further high-level supply signal S1' during the sense mode RX to the MEMS sound transducer 110, and wherein the charge pump arrangement 122-1 of the supply signal provider 122 is configured to provide the high-level supply signal S1 during the transmission mode TX to the MEMS sound transducer 110.

Typical (absolute) voltage values V1 of the high-level supply signal S1 may be in a voltage between 7 and 16 V. Typical (absolute) voltage values V1' of the further high-level supply signal S1' may be in a voltage between 7 and 16 V. Typical (absolute) voltage values $V_{DD}$ of the common supply signal $S_{DD}$ may be in a voltage between 1 and 5 V. The voltage values $V_{DD}$ may form the to the supply voltage of the ASIC 120 (the control circuitry). Thus, typical values for the voltage $V_{DD}$ may be 1.8V for a digital control circuitry and 2.75V for analog control circuitry with allowed +−10% variations, for example.

As exemplarily shown in FIG. 11, the switching arrangement 126 may comprise a first switch element 126-1, which is electrically connected between the terminal 110-3 of the MEMS sound transducer 110 (=of the backplate (stator) 114 and the terminal 124-1 of the read-out circuitry 124. A further (second) switch element 126-3 is electrically connected between the terminal 110-3 of the backplate 114 and the terminal (=output pin) 122-1a of the supply signal provider 122-1 (e.g., a first charge pump arrangement). A hold capacitor 123 is connected between the output terminal 122-1a of the supply signal provider 122-1 and a reference potential $V_{REF}$, e.g. ground potential. The MEMS device 100 comprises the further signal provider 122-2, e.g. in form of a further charge pump arrangement, wherein the output terminal 122-2a of the further signal provider 122-2 is electrically connected to the terminal 110-1 of the membrane structure 112 (=the first terminal 110-1 of the MEMS sound transducer 110) to provide the further high-level supply signal V1' to the terminal 110-1 of the membrane structure 112 of the MEMS sound transducer 110, e.g. during the sense mode of the MEMS sound transducer 110.

The single-ended implementation of FIG. 11 includes two high-voltage switches 126-1, 126-2 at the input of the MEMS interface, i.e. at the terminals 110-1, 110-2 of the MEMS sound transducer 110, that switch at ultrasound frequency during the send mode TX and bringing the membrane 112 of the MEMS sound transducer 110 to pull-in alternatively. The on-chip ultrasound charge-pump 122-1 plus hold capacitor 123 deliver the excitation voltage S1 that is alternatively connected to the membrane 112 of the MEMS sound transducer.

In above evaluations of FIGS. 6 to 11 of a MEMS device 100, the signal provider 122 comprises for example a first and (optionally) a second charge pump arrangement 122-1, 122-2. According to the described embodiments, the charge-pumps 122-1, 122-2 (as supply signal provider) used for excitation of the MEMS sound transducer 110 can be substituted by a circuit block that is able to generate the low-ohmic high voltages V1, V1' (with an absolute value >10V).

According to the different embodiments of the present specification as described above, a hold capacitor 123-1 may be arranged at the output terminal 122-2*a* or 122-2*b* (or at each of the output terminals 122-2*a*, 122-2*b*) of the further signal provider 122-2 for storing and providing the further high-level supply signal S1', i.e. the optional hold capacitor 123-1 may be connected between the respective output terminal 122-2*a*, 122-2*b* of the further signal provider 122-2 and ground potential.

In the following, FIGS. 12*a*-12*d* show an illustration of the temporal course of the different ultrasonic and audio operation modes of the MEMS device 110 and the resulting signals at the different elements of the MEMS device 100 having the MEMS sound transducer 110 and the control circuitry 120.

Figure 12A:
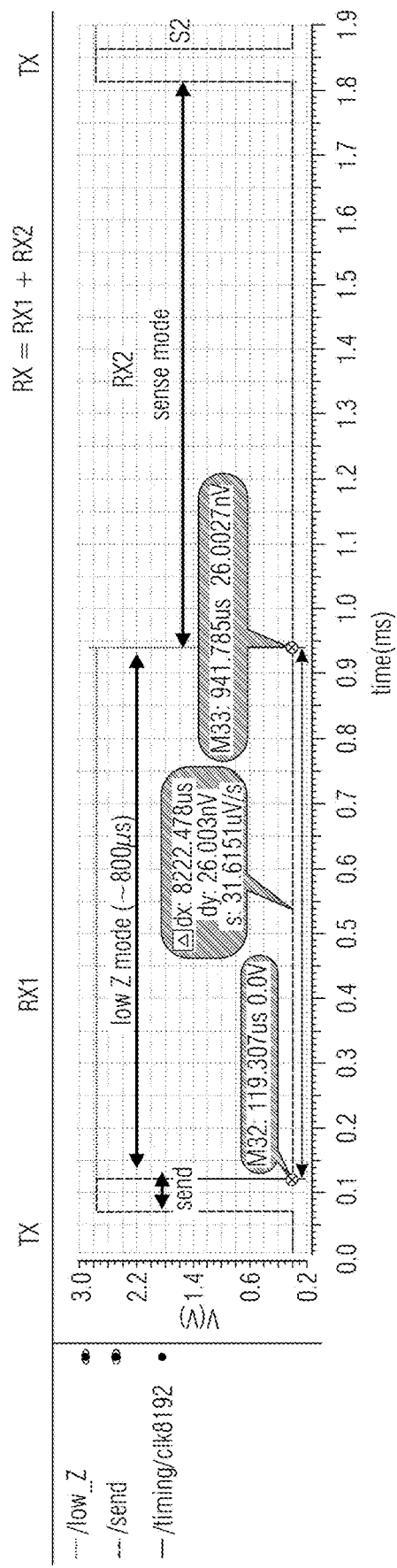
FIG. 12a shows an illustration of a temporal course of the ultrasonic operation modes of the MEMS device according to an embodiment.

Thus, FIG. 12*a* shows the ultrasonic operation modes of the MEMS device based on the different conditions TX, RX (RX with RX1 and RX2) of the control signal S2, i.e., the different conditions of the first and second control signal components S2-1, S2-2 in the sense mode RX and the excitation mode TX, for example. Furthermore, FIG. 12*a* shows a possible time duration (=recovery period) of the low impedance mode (low Z mode=low-ohmic mode) of the interface (=terminals 110-1, . . . , 110-3) of the MEMS sound transducer 110.

As exemplarily shown in FIG. 12*a*, the recovery period may have a duration of about 800 µs based on a clock frequency of 5 MHz and 4,096 periods. Thus, a recovery time duration of 800 µs corresponds to the nearest range for detecting an objection (=nearest detectable object) in the sense mode RX of about 14 cm (≈343 m/s*800 µs)/2, with the speed of sound=343 m/s. Based on a possible variation of the oscillator frequency in a range from about 4 MHz to 7 MHz and a recovery duration RX1 of about 4,096 periods, the nearest detection range (=nearest detectable objects in the sense mode RX) can be adjusted between 9 to 17 cm, for example.

The number of actuation cycles during the send mode TX may be limited, to about 5 (or between 3 and 7), to avoid an excessive discharge of the ultrasonic charge pump node, e.g., having the hold capacitor 123.

Figure 12B:
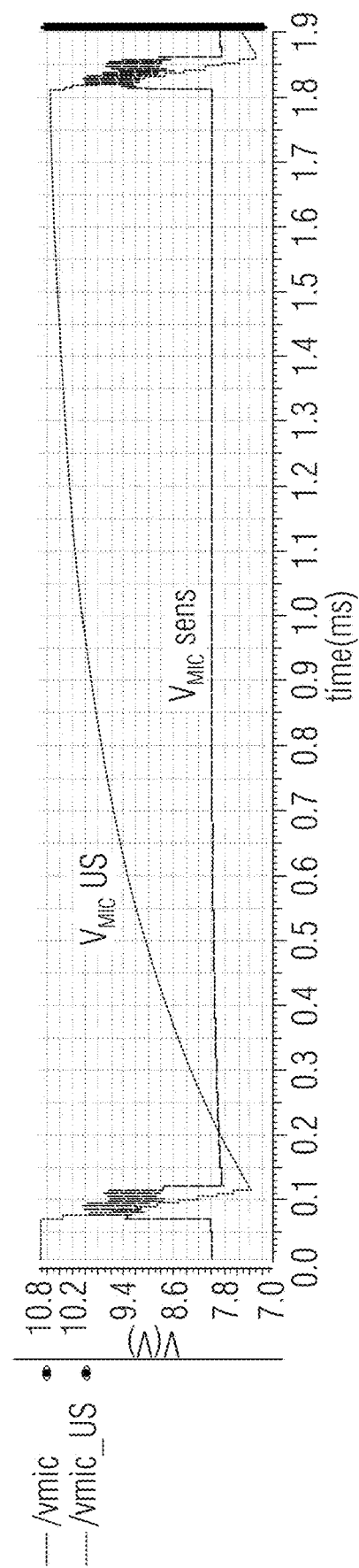
FIG. 12b shows an illustration of a temporal course (of the charge and discharge conditions) of the high-level supply signal at the hold capacitor and the sensed signal of the MEMS device according to an embodiment.

FIG. 12*b* shows a temporal illustration (of the charge and discharge conditions) of the high-level supply signal at the hold capacitor 123 and the sensed signal of the MEMS device 100 according to an embodiment. To be more specific, FIG. 12*b* shows the signal levels (voltages) of the two charge pump arrangements 122-1, 122-2 during the initial excitation phase TX followed by the recovery RX1 and the following sense mode RX2 of the ultrasonic excitation mode.

Figure 12C:
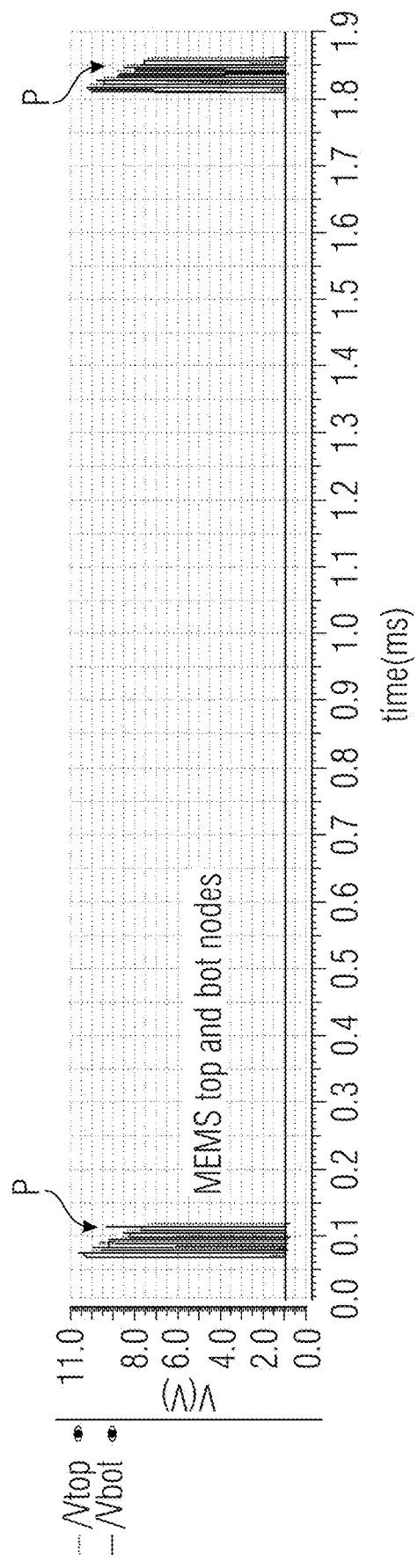
FIG. 12c shows an illustration of a temporal course of the (sense) signals at the nodes for the top and bottom electrodes of the MEMS sound transducer according to an embodiment.

FIG. 12*c* shows the temporal illustration of the (sense) signals at the nodes for the top and bottom electrodes of the MEMS sound transducer 110 (MEMS microphone) according to an embodiment.

Figure 12D:
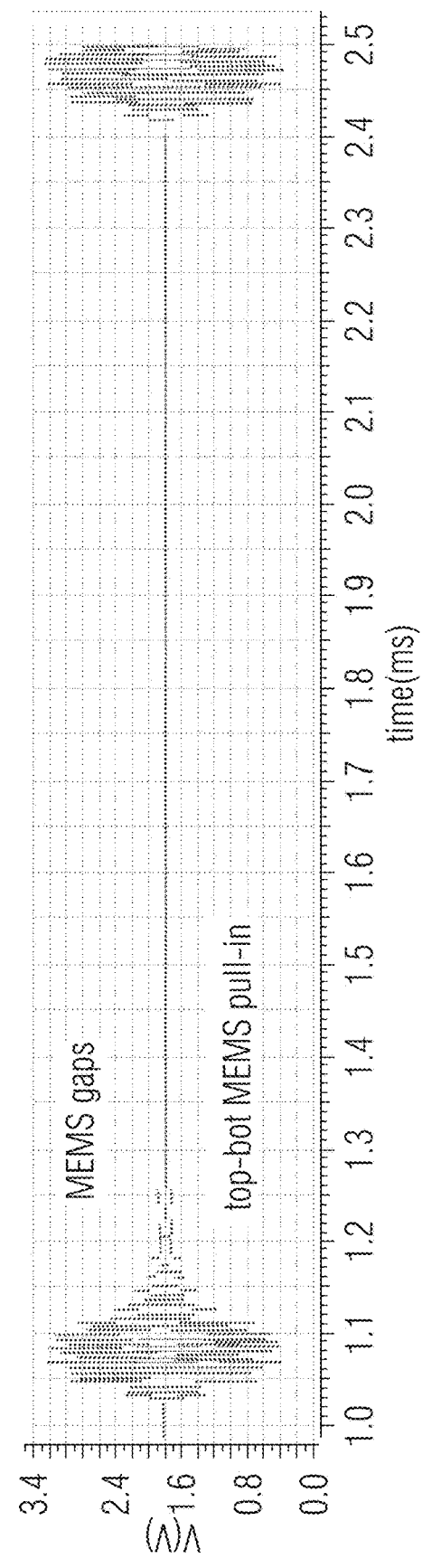
FIG. 12d shows the temporal illustration of the top-bottom-electrode MEMS pull-in signal resulting from the MEMS sound transducer gaps during actuation according to an embodiment.

FIG. 12*d* shows the temporal illustration of the MEMS pull-in signal (voltage) of the top-bottom-electrode resulting from the MEMS sound transducer gaps during actuation according to an embodiment.

FIGS. 12*c* and 12*d* provide the same considerations for the MEMS nodes (first to third terminals 110-1, . . . , 110-3 of the MEMS sound transducer) and their excitation pattern P with alternating high and low voltages and the effects of the actuation on the MEMS displacement (gaps) in FIG. 12*d*.

Figure 13:
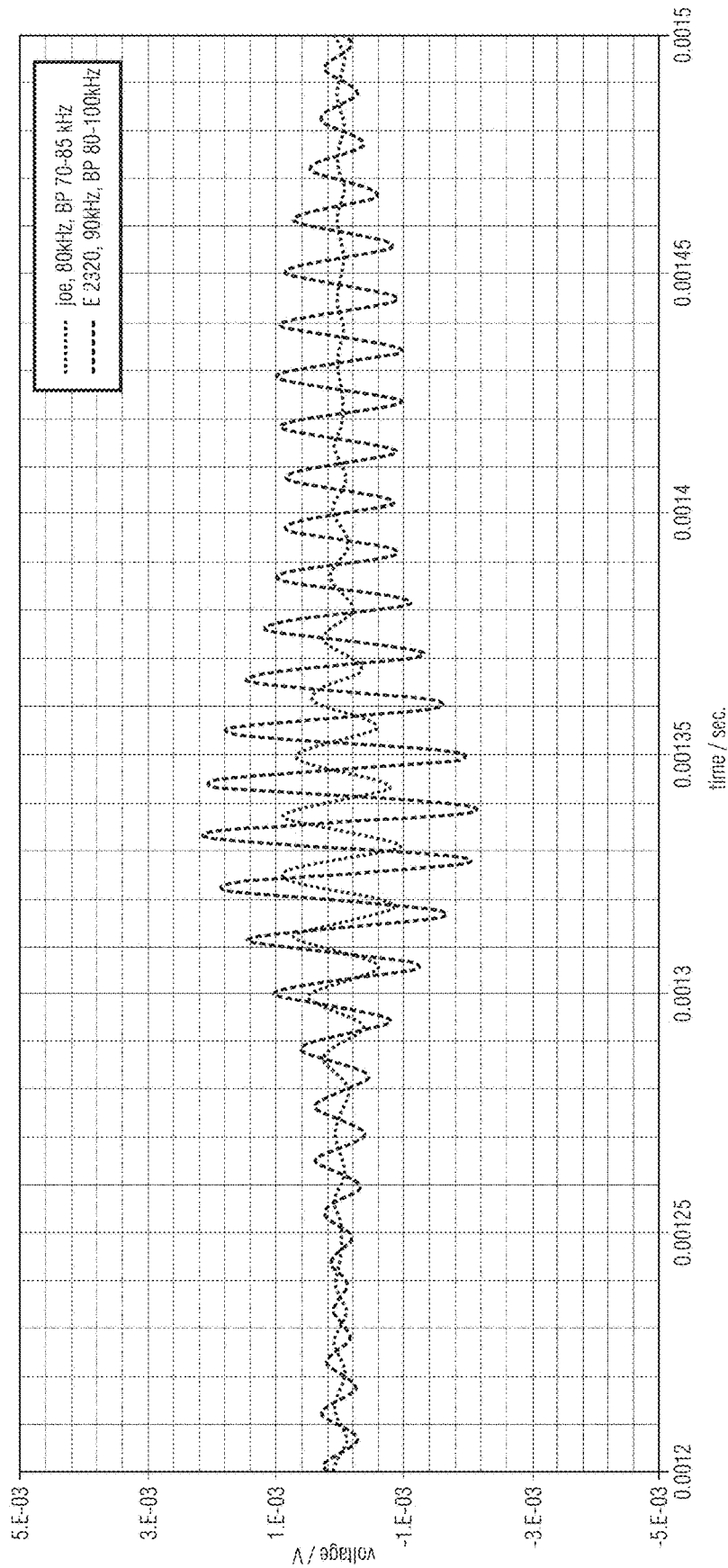
FIG. 13 shows a temporal illustration of the amplitude of the echo signal or received signal of the MEMS device when compared to a single ended implementation according to an embodiment.

FIG. 13 shows a temporal illustration of the amplitude of the echo signal (received signal) of the MEMS device (when compared to a single ended implementation) according to an embodiment.

Figure 14:
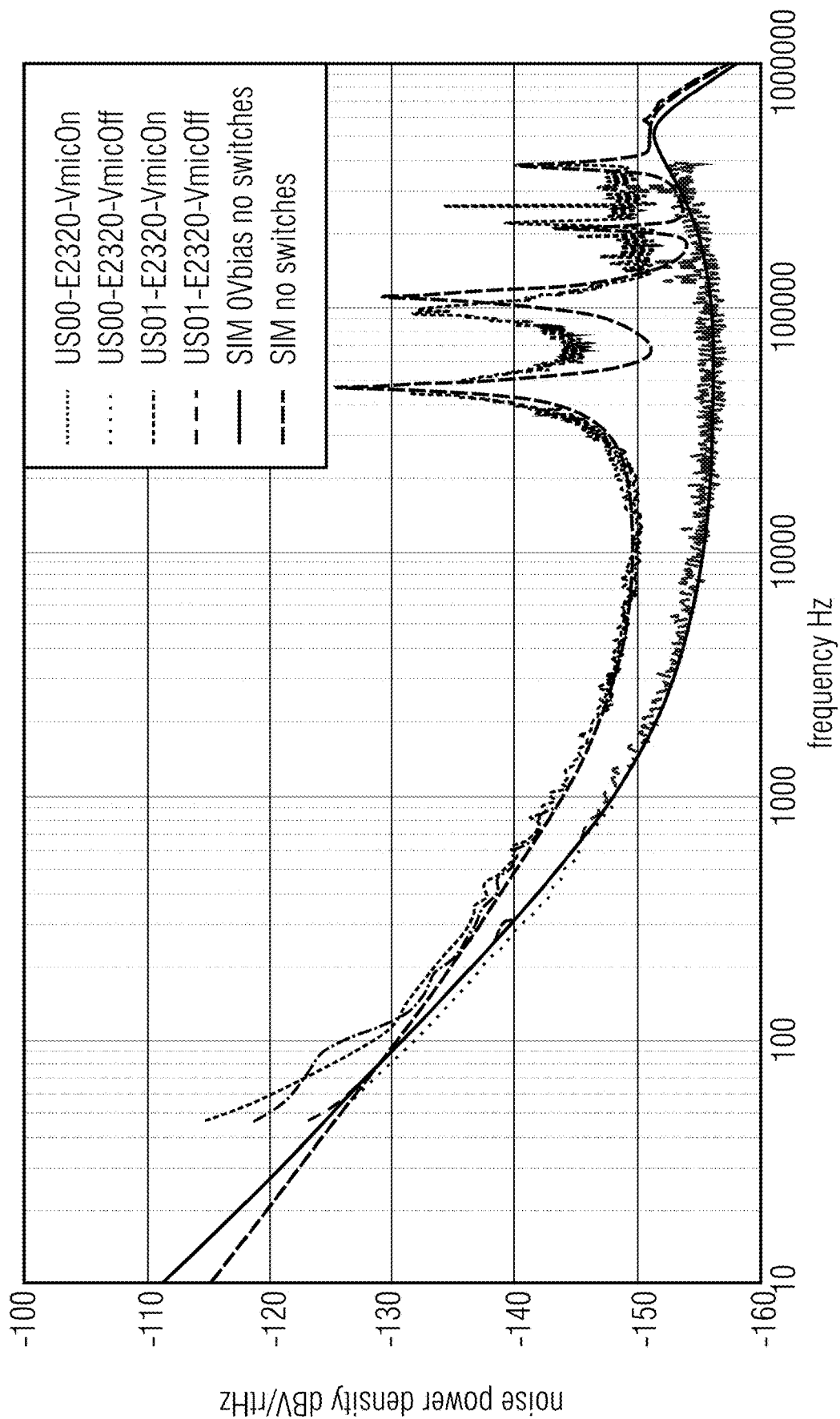
FIG. 14 shows a graphical illustration of the unweighted spectral density measurement of the MEMS device according to an embodiment.

FIG. 14 shows a graphical illustration of the un-weighted spectral density measurement of the MEMS device according to an embodiment.

Based on the illustrations in FIGS. 13 and 14, it can be seen that the above-described MEMS device 100 according to the different embodiments shows excellent characteristics with respect to its audio performance of the MEMS sound transducer 110, to the resulting object detection and the provided ultrasound signal strength.

Embodiments of the present disclosure may provide a so-called combo-sensor solution of an audio microphone and an ultrasonic transducer. Such a solution can be, for example, used for gesture recognition and proximity sensor applications, etc. Embodiments of the MEMS device 100 provide additionally ultrasonic functionality to a MEMS microphone, wherein the efforts for the integration of the MEMS sound transducer for audio and ultrasonic applications, such as additionally circuit components, are relatively low, wherein essentially no changes in the packaging or added hardware are needed.

Additional embodiments and aspects are described which may be used alone or in combi-nation with the features and functionalities described herein.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Depending on certain implementation requirements, embodiments of the control circuitry can be implemented in hardware or in software or at least partially in hardware or at least partially in software. Generally, embodiments of the control circuitry can be implemented as a computer program product with a program code, the program code being operative for performing one of the methods when the computer program product runs on a computer. The program code may for example be stored on a machine readable carrier.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combi-nations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A MEMS device comprising:
a MEMS sound transducer; and
control circuitry comprising:
a supply signal provider for providing a high-level supply signal,
a read-out circuitry for receiving an output signal from the MEMS sound transducer, and
a switching arrangement for selectively connecting the MEMS sound transducer to the supply signal provider, and for selectively connecting the MEMS sound transducer to the read- out circuitry based on a control signal,
wherein the control circuitry is configured to provide the control signal having an ultrasonic actuation pattern to the switching arrangement during a first condition of the control signal, wherein the ultrasonic actuation pattern of the control signal triggers the switching arrangement for alternately coupling the high-level supply signal to the MEMS sound transducer, and
wherein the supply signal provider comprises a hold capacitor for storing the high-level supply signal and for providing the high-level supply signal during the transmission mode to the MEMS sound transducer.

2. The MEMS device according to claim 1, wherein the first condition of the control signal enables a transmission mode of the MEMS sound transducer, and wherein a second condition of the control signal enables a sense mode of the MEMS sound transducer.

3. The MEMS device according to claim 1, wherein the supply signal provider is configured to charge the hold capacitor during the sense mode with the high-level supply signal.

4. The MEMS device according to claim 1, wherein the switching arrangement is configured to decouple the supply signal provider and the hold capacitor during the sense mode from the MEMS sound transducer and the read-out circuitry.

5. The MEMS device according to claim 1, wherein the supply signal provider is configured to provide the high-level supply signal in a low-ohmic configuration, wherein a voltage level of the high-level supply signal is higher than a common supply signal of the MEMS device.

6. The MEMS device according to claim 2, wherein the supply signal provider comprises a charge pump arrangement for providing the high-level supply signal to the MEMS sound transducer, wherein a voltage level of the high-level supply signal is higher than a common supply signal of the MEMS device.

7. The MEMS device according to claim 2, further comprising:
a further charge pump arrangement,
wherein the further charge pump arrangement is configured to provide a further high- level supply signal during the sense mode or the transmission mode to the MEMS sound transducer, and
wherein the supply signal provider is configured to provide the high-level supply signal during the transmission mode to the MEMS sound transducer.

8. The MEMS device according to claim 1, wherein the MEMS sound transducer comprises a membrane structure and a counter electrode structure, wherein the membrane structure and the counter electrode structure are arranged to provide a differential excitation and read-out configuration of the MEMS sound transducer or to provide a single-ended excitation and read-out configuration of the MEMS sound transducer.

9. The MEMS device according to claim 8, wherein the switching arrangement comprises four switches for the differential excitation and read-out configuration of the MEMS sound transducer for alternately coupling the high-level supply signal of the supply signal provider to the MEMS sound transducer during an ultrasonic transmission mode.

10. The MEMS device according to claim 8, wherein the switching arrangement comprises two switches for the single-ended excitation and read-out configuration of the MEMS sound transducer for alternately coupling the high-level supply signal of the supply signal provider to the MEMS sound transducer during an ultrasonic transmission mode.

11. The MEMS device according to claim 1, wherein the switching arrangement is electrically connected between the MEMS sound transducer, the supply signal provider and the read-out circuitry for selectively connecting the MEMS sound transducer to the supply signal provider during an ultrasonic transmission mode, and for selectively connecting an acoustic output signal of the MEMS sound transducer to the read-out circuitry during a sense mode.

12. The MEMS device according to claim 1, wherein the read-out circuitry comprises an operational amplifier for receiving and amplifying an acoustic output signal from the MEMS sound transducer.

13. The MEMS device according to claim 1, wherein a first portion of a sense mode following a transmission mode forms a recovery period of the MEMS sound transducer, wherein the control circuitry provides a low-ohmic interface during the recovery period.

14. The MEMS device according to claim 1, wherein the control signal is based on a first control signal component and a second control signal component, and
wherein the control circuitry is configured to provide the second control signal component having the ultrasonic actuation pattern to the switching arrangement only during a first condition of the first control signal component, wherein the second control signal component triggers the switching arrangement for alternately coupling the high-level supply signal to the MEMS sound transducer based on the ultrasonic actuation pattern.

15. The MEMS device according to claim 14, wherein the first control signal component and the second control signal component are standard digital signals, wherein the control circuitry is configured to gate the second control signal component having the ultrasonic actuation pattern to the switching arrangement for triggering a switching operation only during a presence of a predefined first logic level of the first control signal component, wherein the actuation pattern defines an ultrasonic excitation frequency of the MEMS sound transducer.

16. The MEMS device according to claim 1, wherein the control circuitry is part of an ASIC for providing an integrated on-chip implementation of a signal generation for controlling operational modes of the MEMS sound transducer.

17. A MEMS device comprising:
a MEMS sound transducer, wherein the MEMS sound transducer comprises a membrane structure and a counter electrode structure, wherein the membrane structure and the counter electrode structure are arranged to provide a differential excitation and read-out configuration of the MEMS sound transducer or to provide a single-ended excitation and read-out configuration of the MEMS sound transducer; and
control circuitry comprising:
a supply signal provider for providing a high-level supply signal,
a read-out circuitry for receiving an output signal from the MEMS sound transducer, and
a switching arrangement for selectively connecting the MEMS sound transducer to the supply signal provider, and for selectively connecting the MEMS sound transducer to the read-out out circuitry based on a control signal,
wherein the control circuitry is configured to provide the control signal having an ultrasonic actuation pattern to the switching arrangement during a first condition of the control signal, wherein the ultrasonic actuation pattern of the control signal triggers the switching arrangement for alternately coupling the high-level supply signal to the MEMS sound transducer.

18. A MEMS device comprising:
a MEMS sound transducer; and
control circuitry comprising:
a supply signal provider for providing a high-level supply signal,
a read-out circuitry for receiving an output signal from the MEMS sound transducer, and
a switching arrangement for selectively connecting the MEMS sound transducer to the supply signal provider, and for selectively connecting the MEMS sound transducer to the read- out circuitry based on a control signal,
wherein the control circuitry is configured to provide the control signal having an ultrasonic actuation pattern to the switching arrangement during a first condition of the control signal, wherein the ultrasonic actuation pattern of the control signal triggers the switching arrangement for alternately coupling the high-level supply signal to the MEMS sound transducer, and
wherein the control signal is based on a first control signal component and a second control signal component, and wherein the control circuitry is configured to provide the second control signal component having the ultrasonic actuation pattern to the switching arrangement only during a first condition of the first control signal component, wherein the second control signal component triggers the switching arrangement for alternately coupling the high-level supply signal to the MEMS sound transducer based on the ultrasonic actuation pattern.

19. The MEMS device according to claim 18, wherein the first control signal component and the second control signal component are standard digital signals, wherein the control circuitry is configured to gate the second control signal component having the ultrasonic actuation pattern to the switching arrangement for triggering a switching operation only during a presence of a predefined first logic level of the first control signal component, wherein the actuation pattern defines an ultrasonic excitation frequency of the MEMS sound transducer.

* * * * *